(12) United States Patent
Oosato

(10) Patent No.: US 10,295,714 B2
(45) Date of Patent: May 21, 2019

(54) ELONGATED CIRCULARLY POLARIZING PLATE, ELONGATED BROADBAND LAMBDA/4 PLATE, ORGANIC ELECTROLUMINESCENT DISPLAY DEVICE, AND LIQUID CRYSTAL DISPLAY DEVICE

(71) Applicant: ZEON CORPORATION, Chiyoda-ku, Tokyo (JP)

(72) Inventor: Kazuhiro Oosato, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/511,032

(22) PCT Filed: Sep. 11, 2015

(86) PCT No.: PCT/JP2015/075846
§ 371 (c)(1),
(2) Date: Mar. 14, 2017

(87) PCT Pub. No.: WO2016/047465
PCT Pub. Date: Mar. 31, 2016

(65) Prior Publication Data
US 2017/0276850 A1 Sep. 28, 2017

(30) Foreign Application Priority Data
Sep. 26, 2014 (JP) .................................. 2014-197114

(51) Int. Cl.
*G02B 5/30* (2006.01)
*G02F 1/13* (2006.01)
(Continued)

(52) U.S. Cl.
CPC ............. *G02B 5/3041* (2013.01); *G02B 5/30* (2013.01); *G02B 5/3066* (2013.01); *G02F 1/13* (2013.01);
(Continued)

(58) Field of Classification Search
CPC ....... G02B 5/3041; G02B 5/3066; G02F 1/13; G09G 3/3208
(Continued)

(56) References Cited

U.S. PATENT DOCUMENTS

| 2006/0001799 A1* | 1/2006 | Kawamoto | .......... G02B 5/3016 349/96 |
| 2007/0139773 A1* | 6/2007 | Kawamoto | .......... G02B 5/3016 359/487.05 |

(Continued)

FOREIGN PATENT DOCUMENTS

| CN | 1721893 A | 1/2006 |
| CN | 101473253 A | 7/2009 |

(Continued)

OTHER PUBLICATIONS

Mar. 28, 2017, International Preliminary Report on Patentability issued in the International Patent Application No. PCT/JP2015/075846.

(Continued)

*Primary Examiner* — Frank G Font
(74) *Attorney, Agent, or Firm* — Kenja IP Law PC

(57) ABSTRACT

A long-length circularly polarizing plate including: a polarizing film; a λ/2 plate having a slow axis in a direction forming an angle of 22.5°±10° relative to an absorption axis of the polarizing film; and a plate having a slow axis in a direction forming an angle of 90°±20° relative to an absorption axis of the polarizing film, in this order, wherein the λ/2 plate and the λ/4 plate have different wavelength dispersions, and an NZ factor of the λ/4 plate NZq satisfies NZq≤0.0.

13 Claims, 3 Drawing Sheets

(51) Int. Cl.
*G09G 3/3208* (2016.01)
*G02F 1/13363* (2006.01)
*H01L 51/50* (2006.01)
*H05B 33/02* (2006.01)
*G02F 1/1335* (2006.01)

(52) U.S. Cl.
CPC .... *G02F 1/13363* (2013.01); *G02F 1/133528* (2013.01); *G09G 3/3208* (2013.01); *H01L 51/50* (2013.01); *H05B 33/02* (2013.01); *G02F 2001/133541* (2013.01); *G02F 2001/133637* (2013.01); *G02F 2001/133638* (2013.01); *G02F 2201/56* (2013.01); *G02F 2203/05* (2013.01); *G02F 2203/58* (2013.01); *G02F 2413/02* (2013.01); *G02F 2413/06* (2013.01)

(58) Field of Classification Search
USPC ..................................... 359/483.01
See application file for complete search history.

(56) References Cited

U.S. PATENT DOCUMENTS

| | | | | |
|---|---|---|---|---|
| 2007/0222919 A1* | 9/2007 | Chiba | .................. | G02B 5/3025 349/96 |
| 2009/0052028 A1 | 2/2009 | Umemoto et al. | | |
| 2009/0096970 A1* | 4/2009 | Sakai | .................. | G02B 5/3016 349/117 |
| 2009/0122236 A1* | 5/2009 | Shutou | ................ | G02F 1/13363 349/96 |
| 2011/0222155 A1* | 9/2011 | Sakai | ................... | G02B 5/3083 359/489.07 |
| 2013/0301129 A1 | 11/2013 | In et al. | | |
| 2014/0300845 A1* | 10/2014 | Tamaki | ............. | G02F 1/133514 349/65 |
| 2014/0334001 A1* | 11/2014 | Oh | ....................... | G02B 5/3083 359/489.07 |
| 2014/0375935 A1* | 12/2014 | Yamada | ............... | G02B 5/3025 349/103 |
| 2017/0205663 A1* | 7/2017 | Fukunaga | ......... | G02F 1/133504 |

FOREIGN PATENT DOCUMENTS

| | | |
|---|---|---|
| JP | H05100114 A | 4/1993 |
| JP | 2007004120 A | 1/2007 |
| JP | 2008209652 A | 9/2008 |
| JP | 2009276753 A | 11/2009 |
| JP | 2009288812 A | 12/2009 |
| JP | 2012022148 A | 2/2012 |
| JP | 2013235272 A | 11/2013 |
| WO | 2013137464 A1 | 9/2013 |

OTHER PUBLICATIONS

Dec. 15, 2015, International Search Report issued in the International Patent Application No. PCT/JP2015/075846.

Jul. 17, 2018, the Extended European Search Report issued by the European Patent Office in the corresponding European Patent Application No. 15844168.3.

* cited by examiner

ELONGATED CIRCULARLY POLARIZING PLATE, ELONGATED BROADBAND LAMBDA/4 PLATE, ORGANIC ELECTROLUMINESCENT DISPLAY DEVICE, AND LIQUID CRYSTAL DISPLAY DEVICE

FIELD

The present invention relates to a long-length circularly polarizing plate, a long-length broadband $\lambda/4$ plate, an organic electroluminescent display device, and a liquid crystal display device.

BACKGROUND

Conventionally, a circularly polarizing plate has been provided to an organic electroluminescent display device (hereinafter, may be appropriately referred to as an "organic EL display device") and a liquid crystal display device for reducing reflection of outside light on a display surface in some cases. In general, a film obtained by combining a polarizing film and a $\lambda/4$ plate is used as such a circularly polarizing plate. However, most of conventional $\lambda/4$ plates were actually capable of achieving a phase difference of an approximately quarter wavelength only with light in a specific narrow wavelength range. Therefore, although reflection of outside light in a specific narrow wavelength range can be reduced by the circularly polarizing plate, reduction of reflection of other outside light was insufficient.

To deal with this issue, a broadband $\lambda/4$ plate obtained by combining a $\lambda/4$ plate and a $\lambda/2$ plate has been recently proposed (see Patent Literatures 1 to 3). With the broadband $\lambda/4$ plate, a phase difference of an approximately quarter wavelength for light in a wide wavelength range can be achieved. Therefore, a circularly polarizing plate that can reduce reflection of outside light in a wide wavelength range can be achieved.

CITATION LIST

Patent Literature

Patent Literature 1: Japanese Patent Application Laid-Open No. Hei. 05-100114 A

Patent Literature 2: Japanese Patent Application Laid-Open No. 2007-004120 A (foreign counterpart application: specification of U.S. Patent Application Publication No. 2009/052028)

Patent Literature 3: Japanese Patent Application Laid-Open No. 2013-235272 A (foreign counterpart application: specification of U.S. Patent Application Publication No. 2013/301129)

SUMMARY

Technical Problem

In a circularly polarizing plate obtained by combining a polarizing film and the broadband $\lambda/4$ plate, directions of optical axes including an absorption axis of the polarizing film a slow axis of a $\lambda/2$ plate, and a slow axis of a $\lambda/4$ plate are required to be adjusted such that these optical axes form specific angles.

However, when the circularly polarizing plate is observed from a tilt direction other than a front direction, apparent angles formed by the above-mentioned optical axes may deviate from the specific angles in some cases. As a result, while a conventional circularly polarizing plate is capable of reducing reflection of outside light in a front direction, it may be incapable of effectively reducing reflection of outside light in a tilt direction other than the front direction in some cases. In particular, since the circularly polarizing plate including the broadband $\lambda/4$ plate includes not only the $\lambda/4$ plate but also the $\lambda/2$ plate, the number of optical axes is larger than that of a conventional circularly polarizing plate. Therefore, in the circularly polarizing plate including the broadband $\lambda/4$ plate, the deviation of apparent optical axes is larger than that of a conventional circularly polarizing plate which does not include the $\lambda/2$ plate, and the ability to reduce reflection of outside light in a tilt direction tends to be deteriorated.

Further, an optical film such as the circularly polarizing plate is preferably produced as a long-length film in order to improve production efficiency. However, when the long-length circularly polarizing plate is produced by bonding together a long-length polarizing film, a long-length $\lambda/2$ plate and a long-length $\lambda/4$ plate, it is difficult to adjust orientations of optical axes of the polarizing film, the $\lambda/2$ plate, and the $\lambda/4$ plate so as to form specific angles required for the circularly polarizing plate. As a result, it is difficult to produce the circularly polarizing plate as a long-length film using the long-length polarizing film, the long-length $\lambda/2$ plate, and the long-length $\lambda/4$ plate. Therefore, the circularly polarizing plate is conventionally produced by cutting out a sheet piece of the polarizing film, a sheet piece of the $\lambda/2$ plate, and a sheet piece of the $\lambda/4$ plate from corresponding long-length films while adjusting angles, and bonding them together. Such a process for producing the circularly polarizing plate requires labor and cost (for wasting offcuts and the like).

The present invention has been created in view of the above-mentioned problems, and it is an object of the present invention to provide: a long-length circularly polarizing plate that can be produced as a long-length film and effectively reduce reflection of outside light in both a front direction and a tilt direction; a broadband $\lambda/4$ plate capable of providing a long-length circularly polarizing plate that can be produced as a long-length film and effectively reduce reflection of outside light in both a front direction and a tilt direction; and an organic electroluminescent display device and a liquid crystal display device including a film piece cut out from the circularly polarizing plate and the broadband $\lambda/4$ plate.

Solution to Problem

The present inventor intensively conducted research for solving the above-mentioned problems. As a result, the present inventor has found that it is possible to provide a long-length circularly polarizing plate that can be produced as a long-length film and effectively reduce reflection of outside light in both a front direction and a tilt direction. The long-length circularly polarizing plate is provided by the combination of the following (1) to (3) in a circularly polarizing film including a polarizing film, a $\lambda/2$ plate, and a $\lambda/4$ in this order.

(1) The angle formed by the absorption axis of the polarizing film and the slow axis of the $\lambda/2$ plate is confined within a specific range, and the angle formed by the absorption axis of the polarizing film and the slow axis of the $\lambda/4$ plate is confined within a specific angle.

(2) The wavelength dispersion of the λ/2 plate and the wavelength dispersion of the λ/4 plate are made different from each other.

(3) An NZ factor of the λ/4 plate is set to 0.0 or lower.

The present invention has been achieved on the basis of such findings.

That is, the present invention is as follows.

(1) A long-length circularly polarizing plate comprising: a polarizing film; a λ/2 plate having a slow axis in a direction forming an angle of 22.5°±10° relative to an absorption axis of the polarizing film; and a λ/4 plate having a slow axis in a direction forming an angle of 90°±20° relative to an absorption axis of the polarizing film, in this order, wherein the λ/2 plate and the λ/4 plate have different wavelength dispersions, and an NZ factor of the λ/4 plate NZq satisfies NZq≤0.0.

(2) The long-length circularly polarizing plate according to (1), satisfying the following formula (A):

Reh(400)/Reh(550)<Req(400)/Req(550)

wherein Reh(400) is an in-plane phase difference of the λ/2 plate at a wavelength of 400 nm, Reh(550) is an in-phase difference of the λ/2 plate at a wavelength of 550 nm, Req(400) is an in-plane phase difference of the λ/4 plate at a wavelength of 400 nm, and Req(550) is an in-plane phase difference of the λ/4 plate at a wavelength of 550 nm.

(3) The long-length circularly polarizing plate according to (1) or (2), satisfying the following formula (B):

Req(400)/Req(550)−Reh(400)/Reh(550)=0.12±0.08 wherein Reh(400) is an in-plane phase difference of the λ/2 plate at a wavelength of 400 nm, Reh(550) is an in-plane phase difference of the λ/2 plate at a wavelength of 550 nm, Req(400) is an in-plane phase difference of the λ/4 plate at a wavelength of 400 nm, and Req(550) is an in-plane phase difference of the λ/4 plate at a wavelength of 550 nm.

(4) The long-length circularly polarizing plate according to any one of (1) to (3), wherein an NZ factor of the λ/2 plate NZh and NZq satisfy:

1.0≤NZh≤1.3; and

−1.0≤NZq≤0.0.

(5) The long-length circularly polarizing plate according to any one of (1) to (4), wherein the λ/4 plate comprises a layer that is formed of a material having a negative intrinsic birefringence value.

6. The long-length circularly polarizing plate according to any one of (1) to (5), wherein the λ/2 plate comprises a layer that is formed of a material having a positive intrinsic birefringence value.

(7) The long-length circularly polarizing plate according to any one of (1) to (6), wherein the polarizing film has an absorption axis in a lengthwise direction of the long-length circularly polarizing plate.

(8) A long-length broadband λ/4 plate comprising:

a λ/2 plate having a slow axis in a direction forming an angle of 22.5°±10° relative to a lengthwise direction of the broadband λ/4 plate; and a λ/4 plate having a slow axis in a direction forming an angle of 90°±20° relative to the lengthwise direction of the broadband λ/4 plate, wherein the λ/2 plate and the λ/4 plate have different wavelength dispersions, and an NZ factor of the λ/4 plate NZq satisfies NZq≤0.0.

(9) The long-length broadband λ/4 plate according to (8), wherein the λ/2 plate is produced by a production method including diagonal stretching.

(10) An organic electroluminescent display device comprising a circularly polarizing film piece obtained by cutting out the long-length circularly polarizing plate according to any one of (1) to (7), or a broadband λ/4 film piece obtained by cutting out the long-length broadband λ/4 plate according to (8) or (9).

(11) A liquid crystal display device comprising a circularly polarizing film piece obtained by cutting out the long-length circularly polarizing plate according to any one of (1) to (7), or a broadband λ/4 film piece obtained by cutting out the long-length broadband λ/4 plate according to (8) or (9).

Advantageous Effects of Invention

According to the present invention, there can be provided: a long-length circularly polarizing plate that can be produced as a long-length film and effectively reduce reflection of outside light in both a front direction and a tilt direction; a broadband λ/4 plate capable of providing a long-length circularly polarizing plate that can be produced as a long-length film and effectively reduce reflection of outside light in both a front direction and a tilt direction; and an organic electroluminescent display device and a liquid crystal display device including a film piece cut out from the circularly polarizing plate and the broadband λ/4 plate.

DESCRIPTION OF EMBODIMENTS

Figure 1:
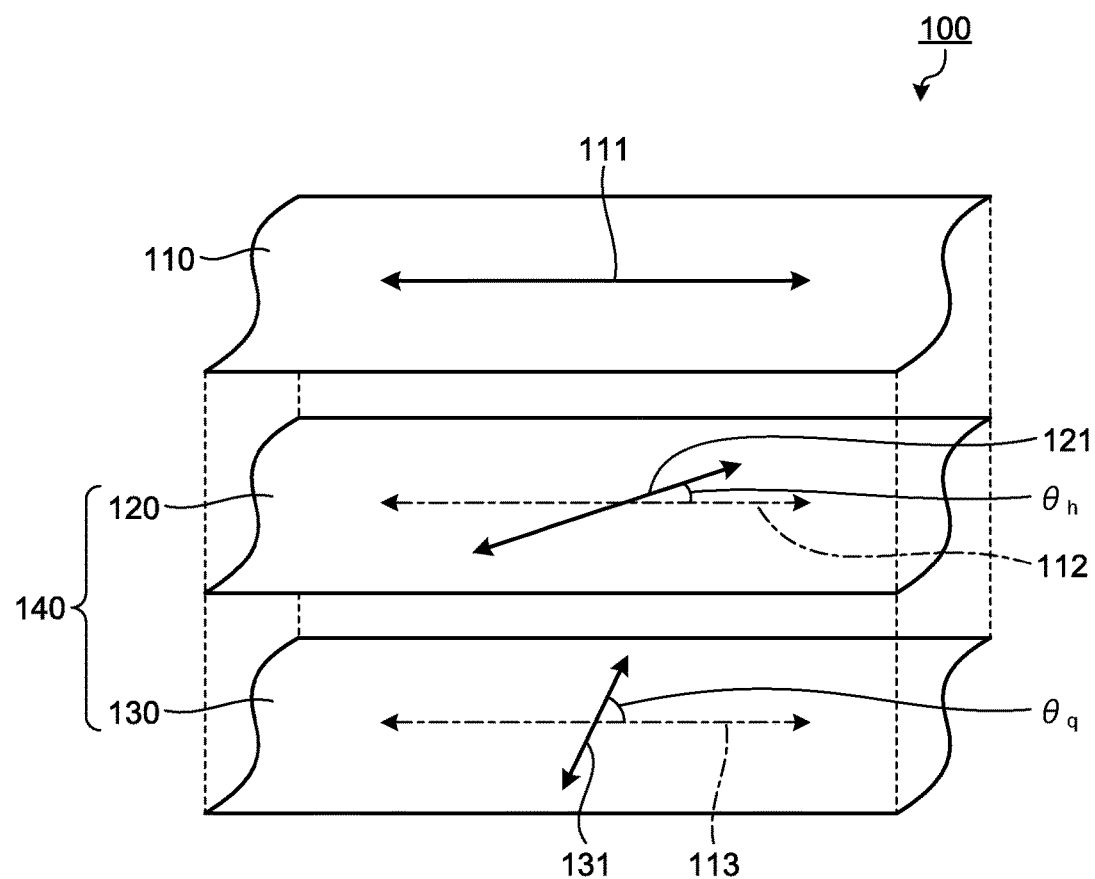
FIG. 1 is an exploded perspective view of a long-length circularly polarizing plate according to an embodiment of the present invention.

Hereinafter, the present invention will be described in detail by illustrating embodiments and examples. However, the present invention is not limited to the following embodiments and examples, which can be freely modified and implemented within the scope not departing from the claims of the present invention and equivalents thereto.

In the following description, a "long-length" film refers to a film having a length of five times or more, and preferably ten times or more the film width.

Specifically, the term refers to a long-length film having a length to be wound up into a roll shape for storage or transportation.

In the following description, an in-plane phase difference Re of a film is a value represented by Re=(nx−ny)×d, unless otherwise stated. A thickness-direction phase difference Rth of a film is a value represented by Rth={(nx+ny)/2−nz}×d, unless otherwise stated. Furthermore, an NZ factor of a film is a value represented by (nx−nz)/(nx−ny), unless otherwise stated. Here, nx represents a refractive index in a direction in which the maximum refractive index is given among directions perpendicular to a thickness direction of the film (in-plane directions), ny represents a refractive index in one of the above-mentioned in-plane directions that is orthogonal to the nx direction, and nz represents a refractive index in a thickness direction of the film. d represents a thickness of a film. The measurement wavelength is 590 nm unless otherwise stated.

In the following description, a positive intrinsic birefringence value means that the refractive index in a stretching direction is larger than the refractive index in a direction orthogonal to the stretching direction, unless otherwise stated. A negative intrinsic birefringence value means that the refractive index in a stretching direction is smaller than the refractive index in a direction orthogonal to the stretching direction, unless otherwise stated. The value of the intrinsic birefringence may be calculated from a dielectric constant distribution.

In the following description, "(meth)acryl-" includes both "acryl-" and "methacryl-".

In the following description, a diagonal direction of a long-length film refers to a direction which is the in-plane direction of the film and neither parallel to nor perpendicular to the width direction of the film, unless otherwise stated.

In the following description, a front direction of a film means the normal line direction of the main surface of the film, unless otherwise stated. Specifically, it indicates a direction in which the polar angle of the main surface is 0° and the azimuth angle of the main surface is 0°.

In the following description, a tilt direction of a film means a direction which is neither parallel to nor perpendicular to the main surface of the film, unless otherwise stated. Specifically, it indicates a direction in which the polar angle of the main surface falls within the range of larger than 0° and smaller than 90°.

In the following description, "parallel", "perpendicular" and "orthogonal", which are directions of an element, may contain an error within the range in which the effects of the present invention are not impaired, for example, in the range of ±5°, unless otherwise stated.

In the following description, a lengthwise direction of a long-length film is usually parallel to a direction of a flow of a film in a production line.

In the following description, a "polarizing plate", a "λ/2 plate", and a "λ/4 plate" each include not only a rigid member, but also a flexible member such as a resin film, unless otherwise stated.

In the following description, angles formed by optical axes (an absorption axis, a slow axis, and the like) of a plurality of films included in a member indicate angles when the films are observed from a thickness direction, unless otherwise stated.

In the following description, a slow axis of a film represents an in-plane slow axis of the film, unless otherwise stated.

[1. Layer Configuration of Circularly Polarizing Plate]

FIG. 1 is an exploded perspective view of a long-length circularly polarizing plate according to an embodiment of the present invention. In FIG. 1, an axis 112 as a projected line of an absorption axis 111 of a polarizing film 110 is indicated with a dot-and-dash line on the surface of a λ/2 plate 120. In FIG. 1, an axis 113 as a projected line of the absorption axis 111 of the polarizing film 110 is indicated with a dot-and-dash line on the surface of a λ/4 plate 130.

As illustrated in FIG. 1, a long-length circularly polarizing plate 100 according to an embodiment of the present invention includes the polarizing film 110, the λ/2 plate 120, and the λ/4 plate 130, in this order in the thickness direction of the circularly polarizing plate 100.

The polarizing film 110 is a polarizing plate having the absorption axis 111. The polarizing film 110 has the function of absorbing linearly polarized light having a vibration direction parallel to the absorption axis 111, and permitting transmission of polarized light other than this linearly polarized light. Here, the vibration direction of linearly polarized light means the vibration direction of the electric field of the linearly polarized light. The absorption axis 111 of the polarizing film 110 is usually in parallel to a lengthwise direction of the polarizing film 110.

The λ/2 plate 120 is a long-length optical member having a specific phase difference. A lengthwise direction of the λ/2 plate 120 is in parallel to the lengthwise direction of the polarizing film 110. This λ/2 plate 120 has a slow axis 121 parallel to the in-plane direction of the λ/2 plate 120, in the direction forming a specific angle θh with respect to the absorption axis 111 of the polarizing film 110.

The λ/4 plate 130 is a long-length optical member having a specific phase difference different from the λ/2 plate 120. A lengthwise direction of the λ/4 plate 130 is in parallel to the lengthwise direction of the polarizing film 110. This λ/4 plate 130 has a slow axis 131 parallel to the in-plane direction of the λ/4 plate 130, in the direction forming a specific angle θq with respect to the absorption axis 111 of the polarizing film 110.

In the long-length circularly polarizing plate 100 having such a structure, a layer portion including the λ/2 plate 120 and the λ/4 plate 130 becomes a broadband λ/4 plate 140. The broadband λ/4 plate 140 is capable of imparting, to light passing through the layer portion, an in-plane phase difference of an approximately quarter wavelength of the light in a wide wavelength range. Therefore, the circularly polarizing plate 100 can function as a circularly polarizing plate which can absorb one of right-handed circularly polarized light and left-handed circularly polarized light and permit transmission of the remaining light in a wide wavelength range.

[2. Polarizing Film]

The polarizing film usually includes a polarizer layer, and if necessary, a protective film layer for protecting the polarizer layer.

The polarizer layer may be obtained by, for example, performing an appropriate treatment in an appropriate order with an appropriate style to a film of an appropriate vinyl alcohol-based polymer. Examples of such a vinyl alcohol-based polymer may include polyvinyl alcohol and partially formalized polyvinyl alcohol. Examples of the film treatment may include a dyeing treatment with a dichroic material such as iodine and a dichroic dye, a stretching treatment, and a crosslinking treatment. In the stretching treatment for producing the polarizer layer, a film before stretching is usually stretched in a lengthwise direction. Therefore, an absorption axis parallel to the lengthwise direction of the polarizer layer may be expressed in the obtained polarizer layer. This polarizer layer is capable of absorbing linearly polarized light having a vibration direction parallel to the absorption axis. In particular, the polarizer layer having an excellent polarization degree is preferable. The thickness of the polarizer layer is, but not limited to, generally 5 μm to 80 μm.

As the protective film layer for protecting the polarizer layer, any transparent film may be used. In particular, a film of a resin which is excellent in transparency, mechanical strength, heat stability, moisture-blocking properties, and the like is preferable. Examples of such a resin may include acetate resin such as triacetyl cellulose, polyester resin, polyether sulfone resin, polycarbonate resin, polyamide resin, polyimide resin, polyolefin resin, cyclic olefin resin, and (meth)acrylic resin. Of these, acetate resin, cyclic olefin resin, and (meth)acrylic resin are preferable in terms of small birefringence, and cyclic olefin resin is particularly preferable from the viewpoint of transparency, low hygroscopicity, size stability, lightweight property, and the like.

The polarizing film described above may be produced, for example, by bonding the long-length polarizer layer and the long-length protective film layer together with their lengthwise directions in parallel to each other by a roll-to-roll method. An adhesive may be used if necessary for bonding them.

The absorption axis of the polarizing film is preferably parallel to the lengthwise direction of the polarizing film. This enables the polarizing film to have its absorption axis in the lengthwise direction of the long-length circularly polarizing plate including the polarizing film. In this case, the long-length circularly polarizing plate can be produced by bonding the long-length polarizing film, a long-length λ/2 plate, and a long-length λ/4 plate such that their lengthwise directions are parallel to one another. Therefore, the long-length circularly polarizing plate according to the present invention can be produced by a roll-to-roll method. Accordingly, the production efficiency of the circularly polarizing plate can be enhanced.

[3. λ/2 Plate]

The λ/2 plate is an optical member having an in-plane phase difference of usually 240 nm or more and usually 300 nm or less at a measurement wavelength of 590 nm. Since the λ/2 plate has such an in-plane phase difference, the broadband λ/4 plate can be achieved by combining the λ/2 plate and the λ/4 plate. Therefore, the circularly polarizing plate according to the present invention can express the function of absorbing one of right-handed circularly polarized light and left-handed circularly polarized light and permitting transmission of the remaining light in a wide wavelength range. Therefore, the circularly polarizing plate of the present invention can reduce reflection of light in a wide wavelength range in both a front direction and a tilt direction. In particular, for effectively reducing the reflection of outside light particularly in a tilt direction, the in-plane phase difference in the λ/2 plate at a measurement wavelength of 590 nm is preferably 250 nm or more, and is preferably 280 nm or less, and more preferably 265 nm or less.

When an NZ factor of the λ/2 plate is represented by NZh, the λ/2 plate preferably satisfies 1.0≤NZh≤1.3. More specifically, the NZ factor (NZh) of the λ/2 plate is preferably 1.0 or more, and more preferably 1.05 or more, and is preferably 1.3 or less, more preferably 1.23 or less, and particularly preferably 1.19 or less. When the NZ factor (NZh) of the λ/2 plate approaches 1.0 as described above, the circularly polarizing plate of the present invention can reduce more effectively reflection of outside light in a tilt direction. Further, the λ/2 plate having such an NZ factor (NZh) can be easily produced.

The λ/2 plate has its slow axis in the direction forming a specific angle θh with respect to the absorption axis of the polarizing film. Regarding this feature, the range of the above-mentioned angle θh is usually 22.5°±10°. When the angle θh formed by the slow axis of the λ/2 plate with respect to the absorption axis of the polarizing film is confined within the above-mentioned range, the broadband λ/4 plate can be provided by combining the λ/2 plate and the λ/4 plate. Therefore, the circularly polarizing plate of the present invention can reduce reflection of light in a wide wavelength range in both a front direction and a tilt direction. The angle θh formed by the slow axis of the λ/2 plate with respect to the absorption axis of the polarizing film is preferably 22.5°±7.5°, and more preferably 22.5°±4.5°. Accordingly, the circularly polarizing plate of the present invention can effectively reduce reflection of outside light particularly in a tilt direction.

As the long-length λ/2 plate having the optical properties described above, a resin film is usually used. Such a resin is preferably a thermoplastic resin. Further, the λ/2 plate may be a resin film of single layer structure having only one layer, and may also be a resin film of multilayer structure having two or more layers.

Of these, the λ/2 plate preferably includes a layer that is formed of a material having a positive intrinsic birefringence value for easy production. As the material having a positive intrinsic birefringence value, a resin having a positive intrinsic birefringence value is usually used. The resin having a positive intrinsic birefringence value contains a polymer having a positive intrinsic birefringence value. Examples of such a polymer may include polyolefins such as polyethylene and polypropylene; polyesters such as polyethylene terephthalate and polybutylene terephthalate; polyarylene sulfides such as polyphenylene sulfide; polyvinyl alcohol; polycarbonate; polyarylate; cellulose ester polymers, polyethersulfone; polysulfone; polyallyl sulfone; polyvinyl chloride; cyclic olefin polymers such as a norbornene polymer; and rod-like liquid crystal polymers. One type of these polymers may be used alone, and two or more types thereof may also be used in combination at any ratio. Further, the polymer may be a homopolymer, and may also be a copolymer. Of these, a polycarbonate polymer is preferable since it is excellent in phase difference expression and stretchability at a low temperature, and a cyclic olefin polymer is preferable since it is excellent in mechanical characteristics, heat resistance, transparency, low hygroscopicity, size stability, and lightweight property.

As the polycarbonate polymer, any polymer having a structural unit including a carbonate bond (—O—C(=O)—O—) may be used. Examples of the polycarbonate polymer may include bisphenol-A polycarbonate, branched bisphenol-A polycarbonate, and o,o,o',o'-tetramethylbisphenol-A polycarbonate.

The cyclic olefin polymer refers to a polymer having a structural unit that has an alicyclic structure. The cyclic olefin polymer may be a polymer having an alicyclic structure in a main chain, a polymer having an alicyclic structure in a side chain, a polymer having alicyclic structures in main and side chains, and a mixture of two or more of these polymers at any ratio. Of these, a polymer having an alicyclic structure in a main chain is preferable from the viewpoint of mechanical strength and heat resistance.

Examples of the alicyclic structure may include a saturated alicyclic hydrocarbon (cycloalkane) structure and an unsaturated alicyclic hydrocarbon (cycloalkene and cycloalkyne) structure. Of these, a cycloalkane structure and a cycloalkene structure are preferable from the viewpoint of mechanical strength and heat resistance. Of these, a cycloalkane structure is particularly preferable.

The number of carbon atoms constituting the alicyclic structure is preferably 4 or more, and more preferably 5 or more, and is preferably 30 or less, more preferably 20 or less, and particularly preferably 15 or less, per alicyclic structure. When the number of carbon atoms constituting the alicyclic structure falls within this range, mechanical strength, heat resistance and moldability of the $\lambda/2$ plate are highly balanced.

In the cyclic olefin polymer, the ratio of the structural unit having the alicyclic structure is preferably 55% by weight or more, further preferably 70% by weight or more, and particularly preferably 90% by weight or more. When the ratio of the structural unit having the alicyclic structure in the cyclic olefin polymer falls within this range, transparency and heat resistance of the $\lambda/2$ plate become favorable.

Of the cyclic olefin polymers, a cycloolefin polymer is preferable. The cycloolefin polymer is a polymer having a structure obtained by polymerizing a cycloolefin monomer. Further, the cycloolefin monomer is a compound having a ring structure formed of carbon atoms and also having a polymerizable carbon-carbon double bond in the ring structure. Examples of the polymerizable carbon-carbon double bond may include a carbon-carbon double bond that is capable of being polymerized in such a manner as a ring opening polymerization. Further, examples of the ring structure of the cycloolefin monomer may include monocyclic, polycyclic, fused polycyclic, and cross-linked cyclic structures, and polycyclic structures that are combinations of the aforementioned structures. Of these, the polycyclic cycloolefin monomer is preferable from the viewpoint of highly balancing characteristics such as dielectric property and heat resistance.

Preferable examples of the cycloolefin polymers described above may include a norbornene-based polymer, a monocyclic olefin-based polymer, a cyclic conjugated diene-based polymer, and hydrogenated products thereof. Of these, the norbornene-based polymer is particularly preferable because of its favorable moldability.

Examples of the norbornene-based polymer may include a ring-opening polymer of a monomer having a norbornene structure and a hydrogenated product thereof; and an addition polymer of a monomer having a norbornene structure and a hydrogenated product thereof. Further, examples of the ring-opening polymer of a monomer having a norbornene structure may include a ring-opening homopolymer of one type of a monomer having a norbornene structure, a ring-opening copolymer of two or more types of monomers having norbornene structures, and a ring-opening copolymer of a monomer having a norbornene structure and another monomer copolymerizable therewith. Further, examples of the addition polymer of a monomer having a norbornene structure may include an addition homopolymer of one type of a monomer having a norbornene structure, an addition copolymer of two or more types of monomers having norbornene structures, and an addition copolymer of a monomer having a norbornene structure and another monomer copolymerizable therewith. Of these, a hydrogenated product of the ring-opening polymer of a monomer having a norbornene structure is particularly preferable from the viewpoint of moldability, heat resistance, low hygroscopicity, size stability, lightweight property, and the like.

Examples of the monomer having a norbornene structure may include bicyclo[2.2.1]hept-2-ene (common name: norbornene), tricyclo[4.3.0.1$^{2,5}$]deca-3,7-diene (common name: dicyclopentadiene), 7,8-benzotricyclo[4.3.0.1$^{2,5}$]deca-3-ene (common name: methanotetrahydrofluorene), tetracyclo[4.4.0.1$^{2,5}$.1$^{7,10}$]dodeca-3-ene (common name: tetracyclododecene), and derivatives of these compounds (for example, those having a substituent on the ring). Examples of the substituent herein may include an alkyl group, an alkylene group, and a polar group. Further, a plurality of such substituents may be bonded to the ring and these substituents may be the same or different from each other. As the monomer having a norbornene structure, one type thereof may be used alone, and two or more types thereof may also be used in combination at any ratio.

Examples of the polar group may include a hetero atom and an atomic group having a hetero atom. Examples of the hetero atom may include an oxygen atom, a nitrogen atom, a sulfur atom, a silicon atom, and a halogen atom. Specific examples of the polar group may include a carboxyl group, a carbonyloxycarbonyl group, an epoxy group, a hydroxyl group, an oxy group, an ester group, a silanol group, a silyl group, an amino group, an amide group, an imide group, a nitrile group, and a sulfonic acid group.

Examples of the monomer copolymerizable with the monomer having a norbornene structure through ring-opening copolymerization may include monocyclic olefins such as cyclohexene, cycloheptene, and cyclooctene, and derivatives thereof; and cyclic conjugated dienes such as cyclohexadiene and cycloheptadiene, and derivatives thereof. As the monomer copolymerizable with the monomer having a norbornene structure through ring-opening copolymerization, one type thereof may be used alone, and two or more types thereof may also be used in combination at any ratio.

The ring-opening polymer of a monomer having a norbornene structure may be produced, for example, by polymerizing or copolymerizing such monomers in the presence of a ring opening polymerization catalyst.

Examples of the monomer addition-copolymerizable with the monomer having a norbornene structure may include $\alpha$-olefins having 2 to 20 carbon atoms such as ethylene, propylene, and 1-butene, and derivatives thereof; cycloolefins such as cyclobutene, cyclopentene, and cyclohexene, and derivatives thereof; and non-conjugated dienes such as 1,4-hexadiene, 4-methyl-1,4-hexadiene, and 5-methyl-1,4-hexadiene. Of these, the $\alpha$-olefins are preferable, and ethylene is more preferable. Further, as the monomer addition-copolymerizable with the monomer having a norbornene structure, one type thereof may be used alone, and two or more types thereof may also be used in combination at any ratio.

The addition polymer of a monomer having a norbornene structure may be produced, for example, by polymerizing or copolymerizing such monomers in the presence of an addition polymerization catalyst.

A hydrogenated product of the ring-opening polymer and a hydrogenated product of the addition polymer described above may be produced, for example, by hydrogenating a carbon-carbon unsaturated bond preferably by 90% or more in a solution of the ring-opening polymer and the addition polymer in the presence of a hydrogenation catalyst containing transition metal such as nickel and palladium.

As the norbornene-based polymer, it is preferable that the polymer has an X: bicyclo[3.3.0]octane-2,4-diyl-ethylene structure and a Y: tricyclo[4.3.0.1$^{2,5}$]decane-7,9-diyl-ethylene structure as the structural units, and that the amount of these structural units is 90% by weight or more with respect to the entire structural units of the norbornene-based polymer, and the weight ratio of X and Y is 100:0 to 40:60. By using such a polymer, the $\lambda/2$ plate containing the norbornene-based polymer can exhibit excellent stability in optical characteristics without having a size change over a long period of time.

Examples of the monocyclic olefin-based polymer may include: an addition polymer of a monocyclic olefin-based monomer, such as cyclohexene, cycloheptene, and cyclooctene.

Examples of the cyclic conjugated diene-based polymer may include: a polymer obtained by the cyclization reaction of an addition polymer of a conjugated diene-based monomer such as 1,3-butadiene, isoprene, and chloroprene; a 1,2- or 1,4-addition polymer of a cyclic conjugated diene-based monomer such as cyclopentadiene and cyclohexadiene; and hydrogenated products thereof.

The weight average molecular weight (Mw) of the polymer contained in the resin having a positive intrinsic birefringence value is preferably 10,000 or more, more preferably 15,000 or more, and particularly preferably 20,000 or more, and is preferably 100,000 or less, more preferably 80,000 or less, and particularly preferably 50,000 or less. When the weight average molecular weight is in such a range, mechanical strength and moldability of the $\lambda/2$ plate are highly balanced, thus being preferable. Herein, the above-mentioned weight average molecular weight is measured in terms of polyisoprene or polystyrene by a gel permeation chromatography using cyclohexane as a solvent (when the sample does not dissolve in cyclohexane, toluene may be used as the solvent).

The molecular weight distribution (weight average molecular weight (Mw)/number average molecular weight (Mn)) of the polymer contained in the resin having a positive intrinsic birefringence value is preferably 1.2 or more, more preferably 1.5 or more, and particularly preferably 1.8 or more, and is preferably 3.5 or less, more preferably 3.0 or less, and particularly preferably 2.7 or less. When the molecular weight distribution is equal to or higher than the lower limit value of the above-mentioned range, it becomes possible to increase the productivity of the polymer and reduce a production cost. Further, when it is equal to or lower than the upper limit value, the amount of low molecular components is reduced, whereby it is possible to suppress relaxation of the film which may be caused by high-temperature exposure, and the stability of the $\lambda/2$ plate can thus be improved.

The ratio of the polymer in the resin having a positive intrinsic birefringence value is preferably 50% by weight to 100% by weight, more preferably 70% by weight to 100% by weight, and particularly preferably 90% by weight to 100% by weight. When the ratio of the polymer falls within the above-mentioned range, the $\lambda/2$ plate can exhibit sufficient heat resistance and transparency.

The resin having a positive intrinsic birefringence value may contain an additive in addition to the above-mentioned polymer. Examples of the additive may include: a coloring agent such as a pigment and a dye; a plasticizer; a fluorescent brightening agent; a dispersant; a thermostabilizer; a light stabilizer; a ultraviolet absorbing agent; an antistatic agent; an antioxidant; a microparticle; and a surfactant. One type of these components may be used alone, and two or more types thereof may also be used in combination at any ratio.

The glass transition temperature Tg of the resin having a positive intrinsic birefringence value is preferably 100° C. or higher, more preferably 110° C. or higher, and particularly preferably 120° C. or higher, and is preferably 190° C. or lower, more preferably 180° C. or lower, and particularly preferably 170° C. or lower. When the glass transition temperature of the resin having a positive intrinsic birefringence value is equal to or higher than the above-mentioned lower limit value of the range, the $\lambda/2$ plate can have enhanced durability under a high temperature environment. When the glass transition temperature is equal to or lower than the upper limit value, a stretching process can be easily performed.

The absolute value of photoelastic coefficient of the resin having a positive intrinsic birefringence value is preferably $10\times10^{-12}$ $Pa^{-1}$ or less, more preferably $7\times10^{-12}$ $Pa^{-1}$ or less, and particularly preferably $4\times10^{-12}$ $Pa^{-1}$ or less. When the absolute value is set within this range, fluctuations of in-plane phase difference of the $\lambda/2$ plate can be reduced. The photoelastic coefficient C is a value represented by $C=\Delta n/\sigma$, where $\Delta n$ is a birefringence and $\sigma$ is a stress.

The total light transmittance of the $\lambda/2$ plate is preferably 80% or more. The light transmittance may be measured using a spectrophotometer (ultraviolet-visible-near-infrared spectrophotometer "V-570" manufactured by Jasco Corporation) in accordance with JIS K0115.

The haze of the $\lambda/2$ plate is preferably 5% or less, more preferably 3% or less, particularly preferably 1% or less, and ideally 0%. Here, the haze may be an average value calculated from measurement at five points using a "turbidimeter NDH-300A" manufactured by NIPPON DENSHOKU INDUSTRIES CO., LTD. in accordance with JIS K7361-1997.

The amount of a volatile component contained in the $\lambda/2$ plate is preferably 0.1% by weight or less, more preferably 0.05% by weight or less, further preferably 0.02% by weight or less, and ideally zero. By reducing the amount of the volatile component, size stability of the $\lambda/2$ plate can be improved and changes with the lapse of time in optical characteristics such as a phase difference can be reduced.

The volatile component herein is a substance having a molecular weight of 200 or less contained at a minute amount in the film, and examples thereof may include a residual monomer and a solvent. The amount of the volatile component may be quantitatively determined, as the total of substances having a molecular weight of 200 or less contained in the film, by dissolving the film in chloroform and analyzing a dissolved matter using a gas chromatography.

The saturated water absorption rate of the $\lambda/2$ plate is preferably 0.03% by weight or less, further preferably 0.02% by weight or less, particularly preferably 0.01% by weight or less, and ideally zero. When the saturated water absorption rate of the $\lambda/2$ plate falls within the above-mentioned range, changes with the lapse of time in optical characteristics such as an in-plane phase difference can be reduced.

The saturated water absorption rate is a value represented by the percentage of an increase in a weight of a film test piece after immersion in water at 23° C. for 24 hours with respect to the weight of the film test piece before immersion.

The thickness of the $\lambda/2$ plate is preferably 10 μm or more, more preferably 15 μm or more, and further preferably 30 μm or more, and is preferably 100 μm or less, more preferably 80 μm or less, and further preferably 60 μm or less. Accordingly, the mechanical strength of the $\lambda/2$ plate can be enhanced.

There is no limitation on the method for producing the $\lambda/2$ plate. For example, when the $\lambda/2$ plate is a resin film made of a thermoplastic resin, the $\lambda/2$ plate may be produced by preparing a pre-stretch film made of a thermoplastic resin and stretching the pre-stretch film so as to express a desired phase difference. During this process, since the $\lambda/2$ plate may have a slow axis in a diagonal direction, the $\lambda/2$ plate is preferably produced by a production method including diagonal stretching. The term "diagonal stretching" herein means that a pre-stretch film is stretched in a diagonal direction. In this manner, the $\lambda/2$ plate can be easily produced.

In particular, when the $\lambda/2$ plate includes a layer formed of a resin having a positive intrinsic birefringence value, the $\lambda/2$ plate is preferably produced by a production method including: a first step (a) of preparing a long-length pre-stretch film including a layer formed of a resin having a positive intrinsic birefringence value; a second step (b) of stretching the long-length pre-stretch film in a diagonal direction to obtain a long-length intermediate film; and a third step (c) of subjecting the intermediate film to a free uniaxial stretching in its lengthwise direction to obtain a long-length λ/2 plate. Hereinafter, this production method will be described by referring to an example.

In the first step (a), a long-length pre-stretch film including a layer formed of a resin having a positive intrinsic birefringence value is prepared. The pre-stretch film may be produced, for example, by a melt molding method or a solution casting method. More specific examples of the melt molding method may include an extrusion molding method, a press molding method, an inflation molding method, an injection molding method, a blow molding method, and a stretch molding method. Of these, the extrusion molding method, the inflation molding method, and the press molding method are preferable for obtaining the λ/2 plate excellent in mechanical strength, surface precision, and the like. Of these, the extrusion molding method is particularly preferable from the viewpoint of enabling to produce the λ/2 plate in an efficient and simple manner.

After the long-length pre-stretch film is prepared in the first step (a), the second step (b) of stretching the long-length pre-stretch film in a diagonal direction is performed to obtain an intermediate film. In the first step, the pre-stretch film is usually stretched using a tenter stretching machine while it is conveyed continuously in its lengthwise direction.

Figure 2:
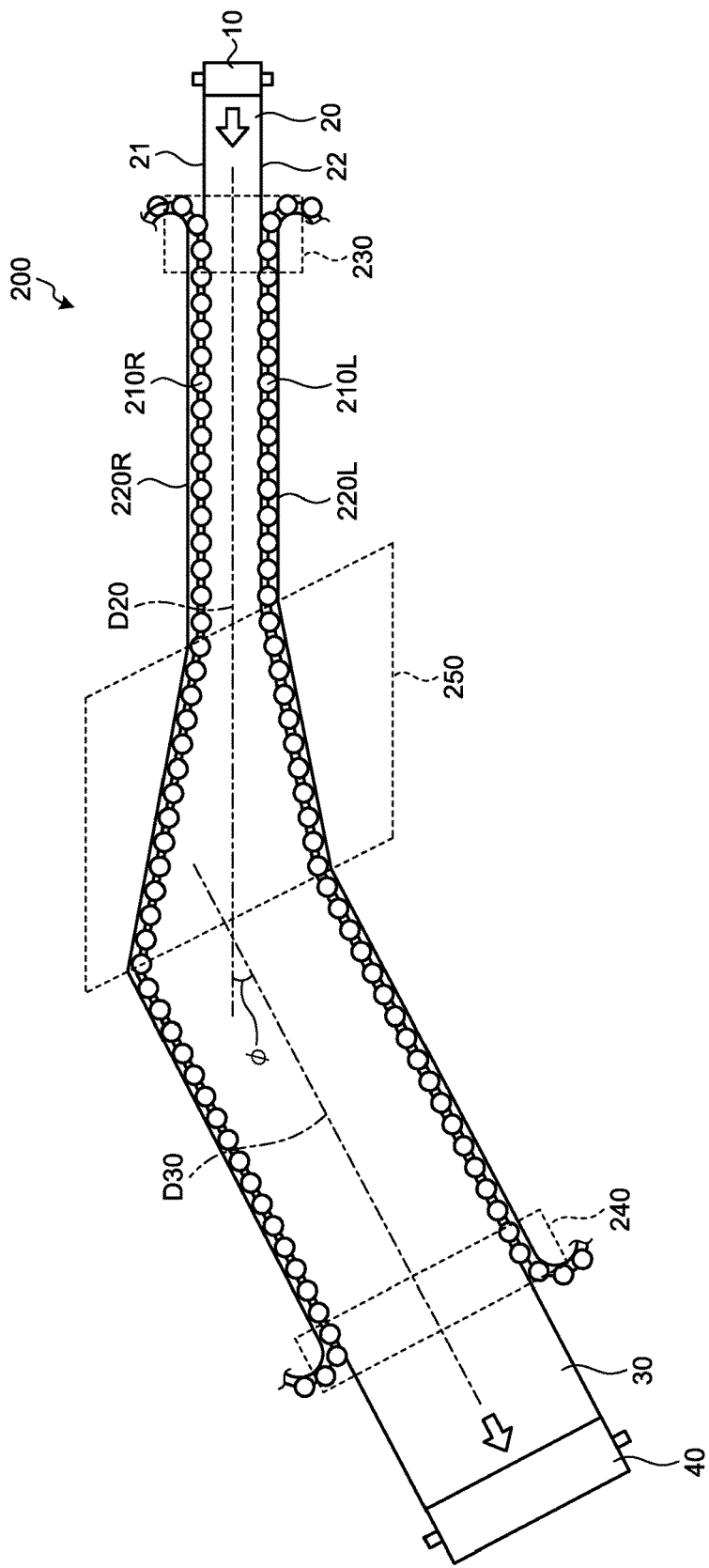
FIG. 2 is a plan view schematically showing one example of a tenter stretching machine used for stretching a pre-stretch film.

FIG. 2 is a plan view schematically showing one example of a tenter stretching machine 200 used for stretching the pre-stretch film.

As shown in FIG. 2, the tenter stretching machine 200 in this example stretches a pre-stretch film 20 fed from a feeding roll 10 in a diagonal direction under an environment heated by an unshown oven.

The tenter stretching machine 200 includes a plurality of grippers 210R and 210L capable of holding end portions 21 and 22, respectively, of the pre-stretch film 20, and a pair of guide rails 220R and 220L provided at both sides of a film conveying path for guiding the above-mentioned grippers 210R and 210L.

The grippers 210R and 210L are provided so as to travel along the guide rails 220R and 220L. The grippers 210R and 210L are provided so as to travel at a constant speed while maintaining a constant distance with the preceding and subsequent grippers 210R and 210L. The grippers 210R and 210L are provided so as to hold both the end portions 21 and 22 in the width direction of the pre-stretch film 20 continuously supplied to the tenter stretching machine 200, at an inlet portion 230 of the tenter stretching machine 200, and to release both the end portions at an outlet portion 240 of the tenter stretching machine 200.

The guide rails 220R and 220L have asymmetric shapes corresponding to conditions, such as a direction of a slow axis and a stretching ratio of the intermediate film 30 to be produced. The tenter stretching machine 200 shown in the present example is provided with a stretching zone 250 in which a distance between the guide rails 220R and 220L becomes wider toward the downstream of the conveying path. In the stretching zone 250, the shapes of the guide rails 220R and 220L are formed in such a manner that a travel distance of the grippers 210R on one side becomes longer than a travel distance of the grippers 210L on the other side. In the tenter stretching machine 200 of the present example, the shapes of the guide rails 220R and 220L are designed such that the grippers 210R and 210L guided by the guide rails 220R and 220L are capable of conveying the pre-stretch film 20 so as to bend the travelling direction of the pre-stretch film 20 toward a left side. Herein, the traveling direction of the long-length film refers to a moving direction of a midpoint in the width direction of the film, unless otherwise stated. Further in the following description of the stretching machine, the terms "right" and "left" refer to directions when a film conveyed in a horizontal state is observed from the upstream to the downstream in a conveyance direction, unless otherwise stated.

The guide rails 220R and 220L includes a continuous endless track so that the grippers 210R and 210L a capable of going around a specific track. Therefore, the tenter stretching machine 200 is configured such that the machine is capable of returning the grippers 210R and 210L, which have released the pre-stretch film 20 at the outlet portion 240 of the tenter stretching machine 200, to the inlet portion 230.

In the second step (b), stretching of the pre-stretch film 20 using such a tenter stretching machine 200 is performed as follows.

The pre-stretch film 20 is fed from the feeding roll 10 and continuously supplied to the tenter stretching machine 200.

In the tenter stretching machine 200, both the end portions 21 and 22 of the pre-stretch film 20 are sequentially held by the grippers 210R and 210L at the inlet portion 230. The pre-stretch film 20 held at its both end portions 21 and 22 is conveyed along with the traveling of the grippers 210R and 210L. As mentioned above, in the tenter stretching machine 200 of the present example, the shapes of the guide rails 220R and 220L are set so as to bend the travelling direction of the pre-stretch film 20 toward the left side. Therefore, a distance of the track on which the grippers 210R on one side travel while holding pre-stretch film 20 becomes longer than a distance of the track on which the grippers 210L on the other side travel while holding the pre-stretch film 20. As a result, among a pair of the gripper 210R and the gripper 210L, facing each other in a direction perpendicular to the traveling direction of the pre-stretch film 20 at the inlet portion 230 of the tenter stretching machine 200, the gripper 210L on the left side comes to precede the gripper 210R on the right side by the time they arrive at the outlet portion 240 of the tenter stretching machine 200, whereby, the pre-stretch film 20 is stretched in a diagonal direction to obtain a long-length intermediate film 30. The intermediate film 30 thus obtained is released from the grippers 210R and 210L at the outlet portion 240 of the tenter stretching machine 200. The intermediate film 30 is then wound into a roll 40 and collected.

The stretching ratio B1 in the second step (b) is preferably 1.1 times or more, and more preferably 1.2 times or more, and is preferably 4.0 times or less, and more preferably 3.0 times or less. When the stretching ratio B1 in the second step (b) is equal to or higher than the lower limit value within the above-mentioned range, a refractive index in the stretching direction can be increased. When it is equal to or lower than the upper limit value, a slow axis direction of the λ/2 plate can be easily controlled.

The stretching temperature T1 in the second step (b) is preferably Tg° C. or higher, more preferably (Tg+2° C.) or higher, and particularly preferably (Tg+5° C.) or higher, and is preferably (Tg+40° C.) or lower, more preferably (Tg+35° C.) or lower, and particularly preferably (Tg+30° C.) or lower. Herein, Tg represents a glass transition temperature of the resin having a positive intrinsic birefringence value contained in the pre-stretch film. In the tenter stretching machine 200, the stretching temperature T1 in the second step (b) represents a temperature of the stretching zone 250 in the tenter stretching machine 200. When the stretching temperature T1 in the second step (b) falls within the above-mentioned range, molecules contained in the pre-stretch film 20 can be reliably oriented, thus making it easy to obtain the intermediate film 30 having desired optical characteristics.

The molecules contained in the intermediate film 30 are oriented by the stretching in the second step (b). And thus, the intermediate film 30 has a slow axis. Since the stretching is performed in a diagonal direction in the second step (b), the slow axis of the intermediate film 30 is expressed in a diagonal direction of the intermediate film 30. Specifically, the intermediate film 30 usually has the slow axis in a range of 5° to 85° relative to its width direction.

A specific direction of the slow axis in the intermediate film 30 is preferably determined in accordance with a slow axis direction of the λ/2 plate to be produced. An angle formed by a slow axis of the λ/2 plate obtained in the third step (c) relative to its lengthwise direction usually becomes smaller than an angle formed by the slow axis of the intermediate film 30 relative to its lengthwise direction. Therefore, the angle formed by the slow axis of the intermediate film 30 relative to its lengthwise direction is preferably made larger than the angle formed by the slow axis of the λ/2 plate relative to its lengthwise direction.

Since the slow axis of the intermediate film 30 is expressed by stretching of the pre-stretch film 20 in a diagonal direction, a specific direction of the slow axis of the intermediate film 30 can be adjusted by the stretching conditions in the second step (b) described above. For example, the direction of the slow axis of the intermediate film 30 can be adjusted by adjusting a feeding angle ϕ formed by a feeding direction D20 of the pre-stretch film 20 from the feeding roll 10 and a winding direction D30 of the intermediate film 30. The feeding direction D20 of the pre-stretch film 20 herein refers to a travel direction of the pre-stretch film 20 fed out from the feeding roll 10. Further, the winding direction D30 of the intermediate film 30 refers to a travel direction of the intermediate film 30 to be wound into the roll 40.

After the second step (b), a third step (c) of subjecting the intermediate film 30 to a free uniaxial stretching in its lengthwise direction is performed to obtain a long-length λ/2 plate. The free uniaxial stretching herein means that a film is stretched in one direction without applying a restraining force to other directions than the stretching direction. Therefore in this example, the free uniaxial stretching of the intermediate film 30 in its lengthwise direction means that the intermediate film 30 is stretched in its lengthwise direction without being restrained at the end portions in its width direction. Such a stretching in the third step (c) is usually performed using a roller stretching machine while the intermediate film 30 is continuously conveyed in its lengthwise direction.

Figure 3:
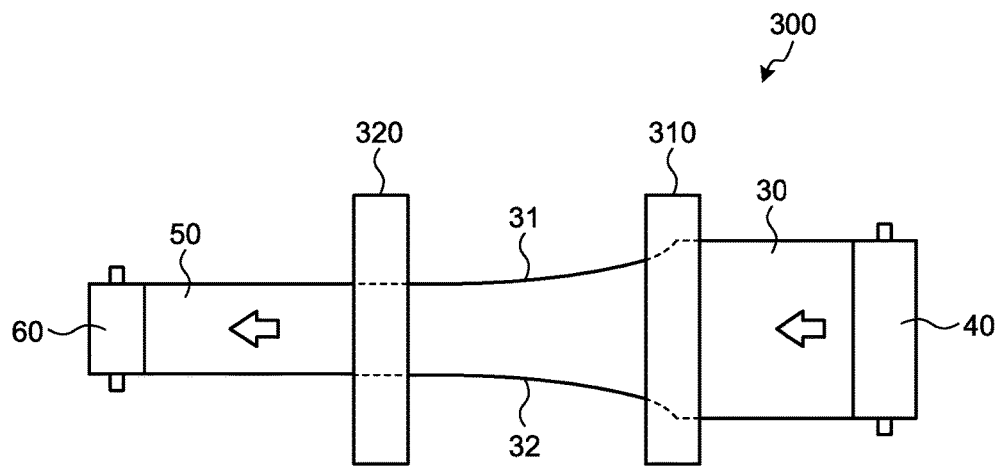
FIG. 3 is a plan view schematically showing one example of a roller stretching machine used for stretching an intermediate film.

FIG. 3 is a plan view schematically showing one example of a roller stretching machine 300 used for stretching the intermediate film 30.

As shown in FIG. 3, the roller stretching machine 300 of the present example stretches the intermediate film 30 fed from a roll 40 in its lengthwise direction under an environment heated by an unshown oven.

The roller stretching machine 300 includes an upstream roll 310 and a downstream roll 320, in this order from the upstream in the conveyance direction, as nip rolls capable of conveying the intermediate film 30 in its lengthwise direction. In this configuration, a rotation speed of the downstream roll 320 is set faster than a rotation speed of the upstream roll 310.

The stretching of the intermediate film 30 using the roller stretching machine 300 described above is performed as follows.

The intermediate film 30 is fed from the roll 40 and continuously supplied to the roller stretching machine 300.

In the roller stretching machine 300, the supplied intermediate film 30 is conveyed through the upstream roll 310 and the downstream roll 320 in this order. During this process, the rotation speed of the downstream roll 320 is faster than the rotation speed of the upstream roll 310, and thus the intermediate film 30 is stretched in its lengthwise direction to produce a λ/2 plate 50. When the intermediate film 30 is stretched in the roller stretching machine 300 described above, both end portions 31 and 32 of the intermediate film 30 in its width direction are not restrained. Thus, the intermediate film 30 is usually contracted in the width direction as the stretching progresses along the lengthwise direction. As a result, the λ/2 plate 50 obtained has a narrower width than the intermediate film 30. In the present example, the λ/2 plate 50 is obtained as a biaxially stretched film stretched in two directions, namely, a lengthwise direction and a diagonal direction.

Subsequently, the λ/2 plate 50 is optionally trimmed at both end portions and wound into a roll 60 and collected.

The stretching ratio B2 in the third step (c) is preferably set smaller than the stretching ratio B1 in the second step (b). With this setting, the λ/2 plate 50 having the slow axis in the diagonal direction can be stretched without causing wrinkles. As described above, the λ/2 plate having the slow axis in a direction of a greater angle relative to the width direction than a conventional uniaxially diagonal-stretched film can be easily produced by combining performing the stretching in the diagonal direction and the free uniaxial stretching in the lengthwise direction in this order, and setting the stretching ratios B1 and B2 to satisfy B1>B2.

Further, uniaxiality of the λ/2 plate 50 can be elevated by increasing the stretching ratio B2 as much as possible. The term "uniaxiality" herein refers to an ability of expressing optical characteristics approximate to those of a stretched film that is stretched in one direction. In the λ/2 plate 50 obtained by stretching a resin having a positive intrinsic birefringence value, the NZ factor (NZh) tends to approach 1.0 when the uniaxiality is higher. When the λ/2 plate 50 has high uniaxiality, the NZ factor (NZh) is made close to 1.0, whereby reflection of outside light in a tilt direction can be reduced more effectively.

The specific stretching ratio B2 in the third step (c) is preferably 1.1 times or more, more preferably 1.15 times or more, and particularly preferably 1.2 times or more, and is preferably 2.0 times or less, more preferably 1.8 times or less, and particularly preferably 1.6 times or less. When the stretching ratio B2 in the third step (c) is equal to or higher than the lower limit value within the above-mentioned range, wrinkles of the λ/2 plate can be prevented. Further, when it is equal to or lower than the upper limit value, a slow axis direction of the λ/2 plate can be easily controlled.

The stretching temperature T2 in the third step (c) is determined on the basis of the stretching temperature T1 in the second step (b), and it is preferably (T1−5° C.) or higher, more preferably (T1−4° C.) or higher, and particularly preferably (T1−3° C.) or higher, and is preferably (T1+5° C.) or lower, more preferably (T1+4° C.) or lower, and particularly preferably (T1+3° C.) or lower. When the stretching temperature T2 in the third step (c) falls within the above-mentioned range, an in-plane phase difference of the λ/2 plate 50 can be effectively adjusted.

The method for producing the λ/2 plate in the above-mentioned example may be implemented with a further modification.

For example, the production method may further include an optional step in addition to the first step (a), the second step (b), and the third step (c). Examples of such an optional step may include a step of providing a protective layer on the surface of the λ/2 plate.

Further, for example, as the pre-stretch film, a pre-stretch film stretched in any direction may be used. As the method of stretching the pre-stretch film before supplying the film to the second step (b), for example, a lengthwise stretching method performed in a roll system and a float system and a transverse stretching method using a tenter stretching machine may be used.

Further, although in the example described above, the intermediate film 30 is wound into the roll 40 and then the intermediate film 30 is fed out from the roll 40 to be supplied to the third step (c), the intermediate film 30 obtained in the second step (b) may be supplied to the third step (c) without winding up the film.

[4. λ/4 Plate]

The λ/4 plate is a long-length optical member having an in-plane phase difference of usually 110 nm or more and usually 154 nm or less at a measurement wavelength of 590 nm. Since the λ/4 plate has such an in-plane phase difference, the broadband λ/4 plate can be achieved by combining the λ/2 plate and the λ/4 plate. Therefore, the circularly polarizing plate according to the present invention can express the function of absorbing one of right-handed circularly polarized light and left-handed circularly polarized light in a wide wavelength range and permitting transmission of the remaining light. Accordingly, the circularly polarizing plate of the present invention can reduce reflection of light in a wide wavelength range in both a front direction and a tilt direction. In particular, for effectively reducing reflection of outside light particularly in a tilt direction, the in-plane phase difference of the λ/4 plate at a measurement wavelength of 590 nm is preferably 118 nm or more, and is preferably 138 nm or less, and more preferably 128 nm or less.

When an NZ factor of the λ/4 plate is represented by NZq, NZq of the λ/4 plate usually satisfies NZq 0.0. More specifically, the NZ factor (NZq) of the λ/4 plate is preferably −1.0 or more, more preferably −0.6 or more, and particularly preferably −0.4 or more, and is usually 0.0 or less. The NZ factor (NZq) of the λ/4 plate being 0.0 or less means that a refractive index nz in a thickness direction of the λ/4 plate is increased. When the refractive index nz in the thickness direction is large, apparent angle errors of the slow axis of the λ/2 plate and the slow axis of the λ/4 plate viewed from a tilt direction can be compensated. As a result, the circularly polarizing plate of the present invention can effectively reduce reflection of outside light in a tilt direction. As the NZ factor (NZq) of the λ/4 plate approaches 0.0, the circularly polarizing plate of the present invention can more effectively reduce reflection of outside light in a tilt direction. Further, the λ/4 plate having the NZ factor (NZq) can be easily produced.

Compensation of the apparent angle errors of the slow axis of the λ/2 plate and the slow axis of the λ/4 plate when viewed from a tilt direction as mentioned above may possibly be achieved also by increasing a refractive index nz in a thickness direction of the λ/2 plate. However, according to the studies of the present inventor, when the refractive index nz of the λ/2 plate in its thickness direction is increased, the refractive index nz of the λ/2 plate in its thickness direction tends to be increased excessively. Thus, it is difficult to stably produce the λ/2 plate having an appropriate refractive index nz in the thickness direction. Therefore, from the viewpoint of improving productivity of the circularly polarizing plate that can reduce reflection of outside light in a tilt direction, the NZq of the λ/4 plate preferably satisfies NZq≤0.0, as mentioned above.

Further, the λ/4 plate has a wavelength dispersion different from that of the λ/2 plate. The wavelength dispersion of a given phase difference film is represented by a value obtained by dividing the in-plane phase difference at a wavelength of 400 nm by the in-plane phase difference at a wavelength of 550 nm. Therefore, the wavelength dispersion of the λ/2 plate is represented by "Reh(400)/Reh(550)", and the wavelength dispersion of the λ/4 plate is represented by "Req(400)/Req(550)". Here, Reh(400) is the in-plane phase difference of the λ/2 plate at a wavelength of 400 nm, Reh(550) is the in-plane phase difference of the λ/2 plate at a wavelength of 550 nm, Req(400) is the in-plane phase difference of the λ/4 plate at a wavelength of 400 nm, and Req(550) is the in-plane phase difference of the λ/4 plate at a wavelength of 550 nm. By combining the λ/2 plate and the λ/4 plate having different wavelength dispersions, reflection of outside light can be reduced in the front direction of the circularly polarizing plate of the present invention.

Further, in the circularly polarizing plate of the present invention, the following formula (A) is preferably satisfied:

$$\text{Reh}(400)/\text{Reh}(550) < \text{Req}(400)/\text{Req}(550) \qquad (A).$$

By satisfying this, reflection of outside light can be effectively reduced in the front direction of the circularly polarizing plate.

Further, in the circularly polarizing plate of the present invention, the following formula (B) is preferably satisfied:

$$\text{Req}(400)/\text{Req}(550) - \text{Reh}(400)/\text{Reh}(550) = 0.12 \pm 0.08 \qquad (B).$$

By satisfying this, reflection of outside light can be particularly effectively reduced in the front direction of the circularly polarizing plate.

The λ/4 plate has a slow axis in a direction forming a specific angle θq relative to an absorption axis of a polarizing film. Regarding this feature, the range of the above-mentioned angle θq is usually 90°±20°. When the angle θq of the slow axis of the λ/4 plate formed relative to the absorption axis of the polarizing film falls within the above-mentioned range, a broadband λ/4 plate can be provided by combining the λ/2 plate and the λ/4 plate. As a result, the circularly polarizing plate of the present invention can suppress light reflection in a wide wavelength range in both a front direction and a tilt direction. Further, the angle θq of the slow axis of the λ/4 plate formed relative to the absorption axis of the polarizing film is preferably 90°±15.0°. Accordingly, the circularly polarizing plate of the present invention can effectively reduce reflection of outside light particularly in a tilt direction.

As the long-length λ/4 plate having the optical characteristics described above, a resin film is usually used. The resin is preferably a thermoplastic resin. Further, the λ/4 plate may be a resin film of single layer structure having only one layer, and may also be a resin film of multilayer structure having two or more layers.

Of these, the λ/4 plate preferably includes a layer formed of a material having a negative intrinsic birefringence value, because the λ/4 plate is easily produced. As the material having a negative intrinsic birefringence value, usually a resin having a negative intrinsic birefringence value is used. The resin having a negative intrinsic birefringence value contains a polymer having a negative intrinsic birefringence value. Examples of the polymer may include a homopolymer of styrene or a styrene derivative and a polystyrene-based polymer containing a copolymer of styrene or a styrene derivative and an optional monomer; a polyacrylonitrile polymer; a polymethyl methacrylate polymer; or a multicomponent copolymer thereof. Examples of the above-mentioned optional monomer copolymerizable with styrene or a styrene derivative may preferably include acrylonitrile, maleic anhydride, methyl methacrylate, and butadiene. One type of these polymers may be used alone, and two or more types thereof may also be used in combination at any ratio.

Of these, the polystyrene-based polymer is preferable from the viewpoint of excellent expression of phase difference, and further the copolymer of styrene or a styrene derivative and maleic anhydride is particularly preferable from the viewpoint of excellent heat resistance. In this case, the amount of the structural unit (maleic anhydride unit) having a structure formed by polymerizing maleic anhydride, relative to 100 parts by weight of the polystyrene-based polymer, is preferably 5 parts by weight or more, more preferably 10 parts by weight or more, and particularly preferably 15 parts by weight or more, and is preferably 30 parts by weight or less, more preferably 28 parts by weight or less, and particularly preferably 26 parts by weight or less.

The ratio of the polymer in the resin having a negative intrinsic birefringence value is preferably 50% by weight to 100% by weight, more preferably 70% by weight to 100% by weight, and particularly preferably 90% by weight to 100% by weight. When the ratio of the polymer falls within the above-mentioned range, the $\lambda/4$ plate can express appropriate optical characteristics.

The resin having a negative intrinsic birefringence value may contain an additive in addition to the above-mentioned polymer. Examples of the additive may include the same additives as those that may be contained in the resin having a positive intrinsic birefringence value. One type of the additives may be used alone, and two or more types thereof may also be used in combination at any ratio.

The glass transition temperature Tg of the resin having a negative intrinsic birefringence value is preferably 80° C. or higher, more preferably 90° C. or higher, further preferably 100° C. or higher, exceptionally preferably 110° C. or higher, and particularly preferably 120° C. or higher. When the glass transition temperature Tg of the resin having a negative intrinsic birefringence value is high, orientation relaxation of the resin having a negative intrinsic birefringence value can be reduced. There is no particular limitation on an upper limit of the glass transition temperature Tg of the resin having a negative intrinsic birefringence value, but it is usually 200° C. or lower.

Some of the resins having a negative intrinsic birefringence value may have low mechanical strength. For example, a resin containing the polystyrene-based polymer tends to have low mechanical strength. Therefore, the $\lambda/4$ plate including a layer that is formed of the resin having a negative intrinsic birefringence value preferably includes a protective layer capable of protecting the layer formed of the resin having a negative intrinsic birefringence value, in combination with the layer formed of the resin having a negative intrinsic birefringence value.

Any layer may be used as the protective layer so long as the advantageous effects of the present invention are not significantly impaired. For example, a layer formed of a resin having a positive intrinsic birefringence value may be used as the protective layer. In such a case, an in-plane phase difference and a thickness-direction phase difference of the protective layer are preferably close to zero from the viewpoint of facilitating the adjustment of a phase difference of the $\lambda/4$ plate. An example of the method of allowing the in-plane phase difference and the thickness-direction phase difference of the protective layer to approach zero may be a method of setting the glass transition temperature of the resin contained in the protective film to be lower than that of the resin having a negative intrinsic birefringence value.

Further the protective layer may be formed on one surface or both surfaces of the layer that is formed of the resin having a negative intrinsic birefringence value.

The total light transmittance of the $\lambda/4$ plate is preferably 80% or more.

The haze of the $\lambda/4$ plate is preferably 5% or less, more preferably 3% or less, particularly preferably 1% or less, and ideally 0%.

The amount of a volatile component contained in the $\lambda/4$ plate is preferably 0.1% by weight or less, more preferably 0.05% by weight or less, further preferably 0.02% by weight or less, and ideally zero. By reducing the amount of the volatile component, size stability of the $\lambda/4$ plate can be improved and changes with the lapse of time in optical characteristics such as a phase difference can be reduced.

The saturated water absorption rate of the $\lambda/4$ plate is preferably 0.03% by weight or less, further preferably 0.02% by weight or less, particularly preferably 0.01% by weight or less, and ideally 0. When the saturated water absorption rate of the $\lambda/4$ plate falls within the above-mentioned range, changes with the lapse of time in optical characteristics such as an in-plane phase difference can be reduced.

The thickness of the $\lambda/4$ plate is preferably 30 or more, more preferably 35 μm or more, and particularly preferably 40 μm or more, and is preferably 80 μm or less, more preferably 75 μm or less, and particularly preferably 70 μm or less. When the thickness of the $\lambda/4$ plate is equal to or more than the lower limit value within the above-mentioned range, a desired phase difference can be easily expressed. When it is equal to or less than the upper limit value, the thickness of the circularly polarizing plate can be reduced.

There is no limitation on a method of producing the $\lambda/4$ plate. For example, when the $\lambda/4$ plate is a resin film made of a thermoplastic resin, the $\lambda/4$ plate may be produced by preparing a pre-stretch film made of a thermoplastic resin and stretching the pre-stretch film so as to express a desired phase difference. During this process, the $\lambda/4$ plate may have a slow axis in its width direction, and thus, the $\lambda/4$ plate is preferably produced by a production method that includes lengthwise stretching or transverse stretching. The lengthwise stretching herein means that the pre-stretch film is stretched in its lengthwise direction, while the term transverse stretching herein means that the pre-stretch film is stretched in its width direction. In this manner, the $\lambda/4$ plate can be easily produced.

In particular, when the $\lambda/4$ plate includes a layer formed of a resin having a negative intrinsic birefringence value, the $\lambda/4$ plate is preferably produced by a production method including a fourth step (d) of preparing a long-length pre-stretch film including a layer formed of a resin having a negative intrinsic birefringence value and a fifth step (e) of stretching the long-length pre-stretch film in its lengthwise direction to obtain the long-length $\lambda/4$ plate. This production method will be described below.

In the fourth step (d), a long-length pre-stretch film including a layer formed of a resin having a negative intrinsic birefringence value is prepared. The pre-stretch film may be produced by a melt molding method or a solution casting method, and the melt molding method is preferable.

As the melt molding method, an extrusion molding method, an inflation molding method, and a press molding method are preferable, and the extrusion molding method is particularly preferable.

When the pre-stretch film is produced as a multilayer film that includes, for example, a layer formed of a resin having a negative intrinsic birefringence value and a protective layer, methods such as: a co-extrusion molding method such as a co-extrusion T-die method, a co-extrusion inflation method, and a co-extrusion lamination method; a film lamination molding method such as dry lamination; and a coating molding method such as coating a certain layer with a resin solution which constitutes a layer other than the certain layer may be used. Of these, the co-extrusion molding method is preferable from the viewpoint of an excellent production efficiency and the viewpoint of eliminating residual volatile components such as a solvent in the λ/4 plate. Among the co-extrusion molding methods, the co-extrusion T-die method is preferable. The co-extrusion T-die method is performed in a feed block system and a multi-manifold system, and the multi-manifold system is further preferable since fluctuations in the layer thickness can be reduced.

After the pre-stretch film is prepared in the fourth step (d), the fifth step (e) of stretching the long-length pre-stretch film in its lengthwise direction is performed to obtain the long-length λ/4 plate. The pre-stretch film is usually stretched while being continuously conveyed along its lengthwise direction using a roller stretching machine.

By stretching the pre-stretch film only in one direction, namely the lengthwise direction, the λ/4 plate having high uniaxiality can be obtained. In the λ/4 plate obtained by stretching the resin having a negative intrinsic birefringence value, the NZ factor (NZq) tends to become closer to 0.0 when the λ/4 plate has higher uniaxiality. Since the λ/4 plate having high uniaxiality can have the NZ factor (NZq) closer to 0.0, reflection of outside light in a tilt direction can be more effectively reduced.

The stretching ratio in the fifth step (e) is preferably 1.1 times or more, more preferably 1.15 times or more, and particularly preferably 1.2 times or more, and is preferably 4 times or less, more preferably 3 times or less, and particularly preferably 2 times or less. When the stretching ratio in the fifth step (e) is confined within the above-mentioned range, the λ/4 plate having desired optical characteristics can be obtained.

The stretching temperature in the fifth step (e) is preferably 110° C. or higher, more preferably 115° C. or higher, and particularly preferably 120° C. or higher, and is preferably 150° C. or lower, more preferably 140° C. or lower, and particularly preferably 130° C. or lower. When the stretching temperature in the fifth step (e) falls within the above-mentioned range, molecules contained in the pre-stretch film can be reliably oriented, and thus the λ/4 plate having desired optical characteristics can be easily obtained.

[5. Optional Layer]

The circularly polarizing plate of the present invention may include an optional layer other than the polarizing film, the λ/2 plate, and the λ/4 plate as long as the effects of the present invention are not significantly impaired.

For example, the circularly polarizing plate of the present invention may include a protective layer for preventing a scratch. Further, for example, the circularly polarizing plate of the present invention may include an adhesive layer or a tacky layer for adhesion of the polarizing film and the λ/2 plate, as well as for adhesion of the λ/2 plate and the λ/4 plate.

[6. Properties of Circularly Polarizing Plate]

When the circularly polarizing plate of the present invention is provided on a surface that can reflect light, the circularly polarizing plate can effectively reduce reflection of outside light in both a front direction and a tilt direction. In particular, the circularly polarizing plate of the present invention is useful in that it can effectively reduce reflection of outside light in a wide wavelength range of visible region.

In general, when a multilayer film including a combination of the λ/4 plate having a slow axis forming an angle θ(λ/4) relative to a given reference direction and the λ/2 plate having a slow axis forming an angle θ(λ/2) relative to the reference direction satisfies the formula C: "(θ(λ/4)=2θ(λ/2)+45°", this multilayer film can serve as a broadband λ/4 plate capable of imparting, to light passing through the multilayer film, an in-plane phase difference of an approximately quarter wavelength of the light in a wide wavelength range (see Patent Literature 2). When the circularly polarizing plate of the present invention includes the λ/2 plate and the λ/4 plate that satisfy a relation approximate to the one represented by the formula C, a portion including the λ/2 plate and the λ/4 plate can function as a broadband λ/4 plate. As a result, the circularly polarizing plate of the present invention can absorb circularly polarized light in a wide wavelength range and thus effectively reduce reflection of outside light.

Further, in the circularly polarizing plate of the present invention, the λ/4 plate expresses a large refractive index nz in the thickness direction. This refractive index nz in the thickness direction can compensate, as described above, apparent angle errors of the slow axis of the λ/2 plate and the slow axis of the λ/4 plate occurring when the circularly polarizing plate is viewed from a tilt direction. As a result, the circularly polarizing plate of the present invention can absorb circularly polarized light in a wide wavelength range, not only in a front direction but also in a tilt direction, and thus effectively reduce reflection of outside light.

Further, the circularly polarizing plate of the present invention can be produced by a roll-to-roll method as described below, within a range of restriction with which the circularly polarizing plate can effectively reduce reflection of outside light in both a front direction and a tilt direction. As a result, the circularly polarizing plate can be efficiency produced.

[7. Method for Producing Circularly Polarizing Plate]

Figure 4:
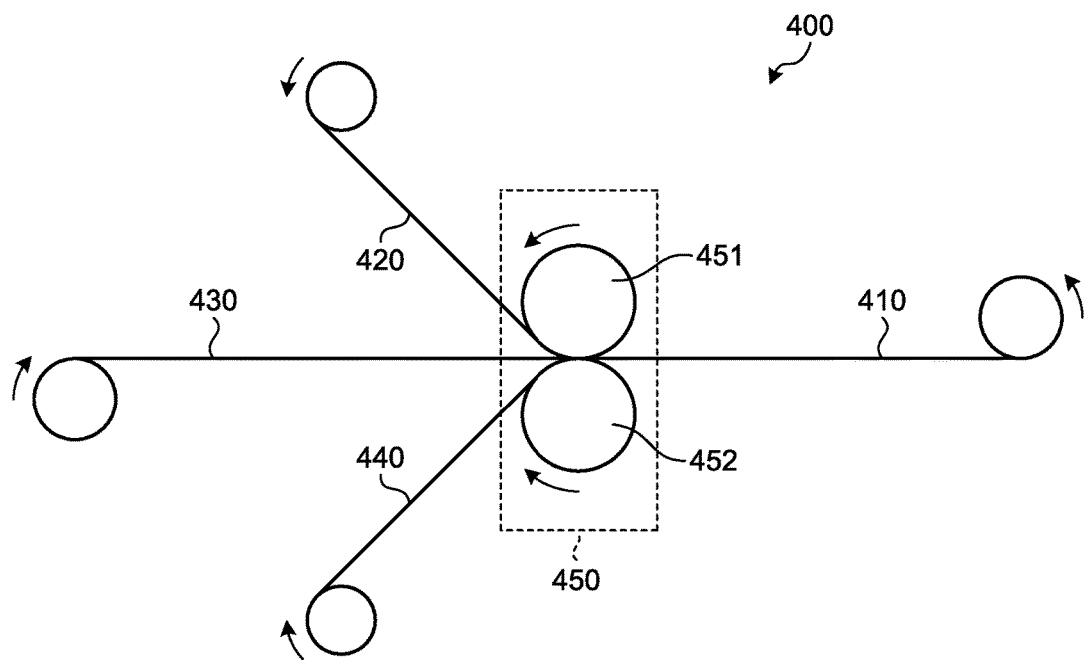
FIG. 4 is a front view schematically showing one example of a production apparatus for producing a long-length circularly polarizing plate.

FIG. 4 is a front view schematically showing one example of a production apparatus 400 for producing a long-length circularly polarizing plate 410.

As shown by the example in FIG. 4, the circularly polarizing plate 410 of the present invention may be produced by bonding a polarizing film 420, a λ/2 plate 430, and a λ/4 plate 440 together with their lengthwise directions in parallel to each other.

For example, when the long-length circularly polarizing plate 410 is produced using the production apparatus 400, the long-length polarizing film 420, the long-length λ/2 plate 430, and the long-length λ/4 plate 440 are fed out from respective rolls and supplied to a bonding device 450 such as nip rolls 451 and 452. In the bonding device 450, the polarizing film 420, the λ/2 plate 430, and the λ/4 plate 440 are bonded together with their lengthwise directions in parallel to each other to obtain a long-length circularly polarizing plate 410. A tacky agent or an adhesive may be optionally used if required in the bonding. The circularly polarizing plate 410 thus produced is usually wound into a roll and collected.

As described above, the circularly polarizing plate 410 of the present invention can be produced by the roll-to-roll method. Therefore, the circularly polarizing plate 410 of the present invention does not require a complicated step of aligning optical axes as in a conventional method where a sheet piece of the polarizing film, a sheet piece of the λ/2 plate, and a sheet piece of the λ/4 plate are bonded together. As a result, the circularly polarizing plate can be efficiently produced. One of the advantageous effects of the present invention is that the circularly polarizing plate 410 realizes both the production by the above-mentioned roll-to-roll method and the effective reduction of reflection of outside light in both a front direction and a tilt direction when provided on a surface that can reflect light.

[8. Broadband λ/4 Plate]

The long-length broadband λ/4 plate of the present invention is an optical member having a structure similar to the portion other than the polarizing film of the long-length circularly polarizing plate of the present invention described above. Therefore, the broadband λ/4 plate of the present invention includes the λ/2 plate and the λ/4 plate described above. The λ/2 plate has a slow axis in a direction having an angle of 22.5°±10° relative to a lengthwise direction of the broadband λ/4 plate, and the λ/4 plate has a slow axis in a direction having an angle of 90°±20° relative to the lengthwise direction of the broadband λ/4 plate.

The broadband λ/4 plate of the present invention can have at least the following advantages.

The broadband λ/4 plate of the present invention can provide light that passes through the broadband λ/4 plate in a front direction with an in-plane phase difference of approximately a quarter wavelength of the wavelength of the light, in a wide wavelength range.

The broadband λ/4 plate of the present invention can provide light that passes through the broadband λ/4 plate in a tilt direction with an in-plane phase difference of approximately a quarter wavelength of the wavelength of the light, in a wide wavelength range.

Therefore, the circularly polarizing plate which can reduce reflection of light in both a front direction and a tilt direction in a wide wavelength range can be achieved by combining the broadband λ/4 plate of the present invention with the polarizing film.

The broadband λ/4 plate of the present invention can be produced by bonding the λ/2 plate and the λ/4 plate together with their lengthwise directions in parallel to each other. As a result, the broadband λ/4 plate of the present invention can be produced by the roll-to-roll method to achieve an efficient production.

[9. Organic Electroluminescent Display Device]

The organic EL display device of the present invention includes a circularly polarizing film piece obtained by cutting out the long-length circularly polarizing plate of the present invention or a broadband λ/4 film piece obtained by cutting out the long-length broadband λ/4 plate of the present invention.

When the organic EL display device of the present invention includes the circularly polarizing film piece, the circularly polarizing film piece is usually provided on a display surface of the organic EL display device. Accordingly, the circularly polarizing film piece can function as an antireflective film of the organic EL display device. That is, when the circularly polarizing film piece is provided on the display surface of the organic EL display device such that the surface on the polarizing film side faces the viewing side, incident light from the outside of the device can be inhibited from being reflected inside the device and being emitted to the outside of the device. As a result, glare on the display surface of the display device can be suppressed. Specifically, only a part of linearly polarized light of the incident light from the outside of the device passes through the polarizing film. The light subsequently passes through the λ/2 plate and the λ/4 plate, thereby to be transformed into circularly polarized light. The circularly polarized light is reflected on a constituent (such as a reflective electrode in the organic EL element) which reflects light within the display device, and thereafter passes through the λ/4 plate and the λ/2 plate again, thereby to be linearly polarized light having its polarizing axis in a direction orthogonal to the polarizing axis of the incident linearly polarized light. The linearly polarized light does not pass through the polarizing film. As a result, the function of antireflection is achieved.

When the organic EL display device of the present invention includes the broadband λ/4 film piece, the organic EL display device may include the broadband λ/4 film piece in an appropriately selected position.

[10. Liquid Crystal Display Device]

The liquid crystal display device of the present invention includes a circularly polarizing film piece obtained by cutting out the long-length circularly polarizing plate of the present invention or a broadband λ/4 film piece obtained by cutting out the long-length broadband λ/4 plate of the present invention.

When the liquid crystal display device of the present invention includes the circularly polarizing film piece, the circularly polarizing film piece is usually provided on a display surface of the liquid crystal display device. In this manner, the circularly polarizing film piece can function as an antireflective film for the liquid crystal display device. That is, when the circularly polarizing film piece is provided on the display surface of the liquid crystal display device such that the surface on the polarizing film side faces a viewer side, incident light from the outside of the device can be inhibited from being reflected inside the device and being emitted to the outside of the device. As a result, glare of the display surface of the display device can be suppressed.

When the liquid crystal display device of the present invention includes the broadband λ/4 film piece, the broadband λ/4 film piece is usually provided on a viewer side of a liquid crystal panel in the liquid crystal display device. In this manner, the broadband λ/4 film piece can function as a film that enhances the visibility of the display surface for an observer wearing polarizing sunglasses. Specifically, the circularly polarizing film piece is provided at a position closer to the display surface than a viewer-side polarizer of the liquid crystal panel in the liquid crystal display device. In this configuration, the slow axis of the λ/2 plate of the broadband λ/4 film piece is set to form an angle of 22.5°±10° relative to the absorption axis of the viewer-side polarizer. In this manner, linearly polarized light passing through the viewer-side polarizer is converted to circularly polarized light by the broadband λ/4 film piece, and thus, light emitted from the display surface can be stably recognized visually through the polarizing sunglasses.

EXAMPLES

Hereinafter, the present invention will be specifically described with reference to Examples. However, the present invention is not limited to the following examples. The present invention may be freely modified and practiced without departing from the scope of claims of the present invention and equivalents thereto.

Unless otherwise stated, "%" and "part" that represent an amount of a material in the following description are on the basis of weight. Unless otherwise stated, the operations described below were performed under the conditions of normal temperature and normal pressure.

[Evaluation Method]

(Method for Measuring Phase Difference And NZ Factor)

Using a phase difference measurement apparatus ("KOBRA-21ADH" manufactured by Oji Scientific Instruments, Co. Ltd.), the in-plane phase difference and the thickness-direction phase difference were measured at a plurality of points at intervals of 50 mm in the width direction of a film. Average values of the values measured at these points were calculated. These average values were defined as the in-plane phase difference and the thickness-direction phase difference of the film. At this time, the measurement was performed at wavelengths of 400 nm, 550 nm, and 590 nm. The NZ factor was calculated from the in-plane phase difference and the thickness-direction phase difference thus obtained.

(Visual Evaluation Method)

A mirror having a planar reflective surface was prepared. This mirror was placed such that its reflective surface was in horizontal angle facing upward. The circularly polarizing plate was bonded on the reflective surface of this mirror such that the polarizing film side faced upward.

Thereafter, the circularly polarizing plate on the mirror was visually observed while the circularly polarizing plate was irradiated with sunlight on a sunny day. The observation was performed in both (i) the front direction at a polar angle of 0° and an azimuth angle of 0° and (ii) the tilt direction at a polar angle of 45° and an azimuth angle of 0° to 360°, of the circularly polarizing plate.

In the observation in (i) the front direction, it was evaluated whether reflection of sunlight is hardly noticeable and the circularly polarizing plate looks black.

In the observation in (ii) the tilt direction, it was evaluated whether the reflectivity and the color tone do not change with the rotation of the azimuth angle.

The above-mentioned visual evaluation was performed by 20 observers, and each observer ranked all results obtained in Examples and Comparative Examples and gave points in accordance with the ranking order (23 points for first place, 22 points for second place, . . . , 1 point for last place). Then, Examples and Comparative Examples were sorted in the order according to scores obtained by calculating the total points given by the observers and rated as A, B, C, D, and E in the descending order from the top group within the range of the scores.

(Method for Calculating Reflectivity by Simulation)

The circularly polarizing plates produced in Examples and Comparative Examples were modeled using, as a simulation software, "LCD Master" manufactured by SHINTEC, Inc., and the reflectivity of each of the modeled circularly polarizing plates was calculated.

The model for the simulation had a structure in which the λ/4 plate side of the circularly polarizing plate was bonded on a planar reflective surface of a mirror. Therefore, this model had a structure in which the polarizing film, the λ/2 plate, the λ/4 plate, and the mirror were provided in this order in the thickness direction.

In the above-mentioned model, the reflectivity when the circularly polarizing plate was irradiated with light from a D65 light source was calculated in (i) the front direction and (ii) the tilt direction of the circularly polarizing plate. Here, in (i) the front direction, the reflectivity in a direction at a polar angle of 0° and an azimuth angle of 0° was calculated. In (ii) the tilt direction, the reflectivity at a polar angle of 45° was calculated for every 5° in the azimuth angle direction within the azimuth angle range of 0° to 360°, and an average of the calculated values was employed as the reflectivity in the tilt direction of the modeled circularly polarizing plate. In the simulation, a surface reflection component actually generated on the surface of the polarizing film was eliminated from the reflectance.

Examples 1-1 to 1-8

(1-i. Production of Polarizing Film)

A long-length pre-stretch film made of a polyvinyl alcohol resin, which had been dyed with iodine, was prepared. This pre-stretch film was stretched in a lengthwise direction which forms an angle of 90° with respect to the width direction of the pre-stretch film, thereby to obtain a long-length polarizing film. This polarizing film had its absorption axis in the lengthwise direction of the polarizing film, and its transmission axis in the width direction of the polarizing film.

(1-ii. Production of λ/2 Plate)

In a nitrogen-purged reaction vessel, 7 parts of a mixture of tricyclo[4.3.0.1$^{2,5}$]deca-3-ene (hereinafter referred to as "DCP"), tetracyclo[4.4.0.1$^{2,5}$.1$^{7,10}$]dodeca-3-ene (hereinafter referred to as "TCD"), and tetracyclo[9.2.1.0$^{2,10}$.0$^{3,8}$]tetradeca-3,5,7,12-tetraen (hereinafter referred to as "MTF") (weight ratio: DCP/TCD/MTF=55/40/5) (1% by weight with respect to total amount of monomers used for polymerization) and 1600 parts of cyclohexane were placed. In this reaction vessel, 0.55 parts of tri-i-butylaluminum, 0.21 parts of isobutyl alcohol, 0.84 parts of diisopropyl ether as a reaction controlling agent, and 3.24 parts of 1-hexene as a molecular weight regulator were further placed. To the mixture, 24.1 parts of a tungsten hexachloride solution prepared by dissolving tungsten hexachloride in cyclohexane at a concentration of 0.65% was further added, and the mixture was stirred at 55° C. for 10 minutes. Subsequently, 693 parts of the mixture of DCP, TCD, and MTF (weight ratio: DCP/TCD/MTF=55/40/5) and 48.9 parts of the tungsten hexachloride solution prepared by dissolving tungsten hexachloride in cyclohexane at a concentration of 0.65% were each continuously added dropwise to the reaction system over 150 minutes while maintaining the reaction system at 55° C. Then, the reaction was continued for another 30 minutes to complete the polymerization, thereby obtaining a ring opening polymerization reaction solution that contains a ring-opening polymer in cyclohexane. After completing the polymerization, a polymerization conversion ratio of monomers measured by a gas chromatography was 100% at the time of completing the polymerization.

The ring opening polymerization reaction solution thus obtained was transferred to a pressure-resistant hydrogenation reaction vessel. Then, 1.4 parts of a nickel catalyst supported on diatomaceous earth (product name "T8400RL" manufactured by Nikki Chemical Co., Ltd., nickel carrying rate of 57%) and 167 parts of cyclohexane were added thereto and reaction was performed at 180° C. for 6 hours under a hydrogen pressure of 4.6 MPa. A reaction solution containing a hydrogenated product of the ring-opening polymer was obtained as a result of this hydrogenation reaction. This reaction solution was subjected to pressure filtration (product name "FUNDABAC filter" manufactured by IHI Corp.) using Radiolite#500 as a filtration bed under a pressure of 0.25 MPa to remove the hydrogenation catalyst, thereby obtaining a colorless and transparent solution.

Subsequently, 0.5 parts of an antioxidant (pentaerythritol tetrakis[3-(3,5-di-t-butyl-4-hydroxyphenyl) propionate], product name "Irganox 1010", manufactured by Ciba Specialty Chemicals) per 100 parts of the hydrogenated product were added and dissolved in the obtained solution. Subsequently, the solution was filtered through a Zeta-plus filter 30H (manufactured by CUNO, pore size of 0.5 μm to 1 μm), and further filtered through another metal fiber filter (manufactured by Nichidai Co., Ltd., pore size of 0.4 μm) to remove a minute solid content. A hydrogenation rate of the hydrogenated product of the ring-opening polymer was 99.9%.

Subsequently, the solution obtained by the filtration described above was treated at a temperature of 270° C. and a pressure of not more than 1 kPa using a cylindrical evaporator (manufactured by Hitachi Ltd.) to remove the solvent cyclohexane and other volatile components. A solid content contained in the solution was then extruded to have a strand-like shape in a molten state from a die directly connected to a concentrator and cooled to obtain pellets of the hydrogenated product of the ring-opening polymer. The hydrogenated product of the ring-opening polymer constituting the pellets had a weight-average molecular weight (Mw) of 38,000, a molecular weight distribution (Mw/Mn) of 2.5, and a glass transition temperature Tg of 129° C. The hydrogenated product of the ring-opening polymer is a material having a positive intrinsic birefringence value.

The pellets of hydrogenated product of the ring-opening polymer thus produced were dried at 100° C. for 5 hours. The pellets were supplied to an extruder, melted in the extruder, passed through a a polymer pipe and a polymer filter, and then extruded from a T-die to be in a sheet shape on a casting drum. The extruded resin was cooled and cured on the casting drum to obtain a long-length pre-stretch film. The thickness of this pre-stretch film was adjusted in a range of 50 μm to 100 μm so as to enable production of a λ/2 plate having properties shown in Table 1 below.

The pre-stretch film was wound to obtain a feeding roll.

As shown in FIG. 2, a tenter stretching machine capable of stretching the pre-stretch film while bending a travelling direction of the pre-stretch film was prepared. The long-length pre-stretch film was fed out from the feeding roll and stretched in the above-mentioned tenter stretching machine to obtain an intermediate film. The intermediate film thus obtained was wound into a roll and collected. During this process, the feeding angle φ formed by a feeding direction of the pre-stretch film from the feeding roll and a winding direction of the intermediate film was set to 45°. The stretching temperature and the stretching ratio were adjusted in a range of 130° C. to 140° C. and a range of 1.3 times to 2.0 times, respectively, so as to enable production of a λ/2 plate having properties shown in Table 1 below.

The intermediate film thus obtained was subjected to a free uniaxial stretching in a lengthwise direction of the intermediate film to obtain a stretched film. During this process, the stretching temperature and the stretching ratio were adjusted in a range of 120° C. to 135° C. and a range of 1.1 times to 1.6 times, respectively, so as to enable production of a λ/2 plate having properties shown in Table 1 below. The stretched film was trimmed at both end portions in its width direction to obtain a long-length λ/2 plate. The long-length λ/2 plate thus obtained had a slow axis in a direction forming an angle θh shown in Table 1 relative to a lengthwise direction of the λ/2 plate.

(1-iii. Production of λ/4 Plate)

As a material having a negative intrinsic birefringence value, a styrene-maleic acid copolymer resin ("Daylark D332" manufactured by NOVA Chemicals Corp., glass transition temperature of 130° C., content of oligomer component of 3% by weight) was prepared.

As an acrylic resin for a protective layer, "Sumipex HT-55X" (glass transition temperature of 105° C.) manufactured by Sumitomo Chemical Co., Ltd. was prepared.

As an adhesive, a modified ethylene-vinyl acetate copolymer ("Modic AP A543" manufactured by Mitsubishi Chemical Corporation, Vicat softening point of 80° C.) was prepared.

The styrene-maleic acid copolymer resin, the acrylic resin, and the adhesive thus prepared were co-extruded to obtain a long-length pre-stretch film including a layer of the acrylic resin, a layer of the adhesive, a layer of the styrene-maleic acid copolymer resin, a layer of the adhesive, and a layer of the acrylic resin in this order. The thickness of the layer of the styrene-maleic acid copolymer resin in the pre-stretch film was adjusted in a range of 40 μm to 100 μm so as to enable production of a λ/4 plate having properties shown in Table 1 below.

Subsequently, the pre-stretch film was stretched in its lengthwise direction forming an angle of 90° relative to its width direction, thereby to obtain a long-length λ/4 plate. During this process, the stretching temperature and the stretching ratio were adjusted in a range of 120° C. to 140° C. and a range of 1.2 times to 2.0 times, respectively, so as to enable production of a λ/4 plate having properties shown in Table 1 below. The λ/4 plate thus obtained had a slow axis in a direction forming an angle θq shown in Table 1 relative to a lengthwise direction of the λ/4 plate. In the λ/4 plate, no phase difference was expressed in the layer of the acrylic resin and the layer of the adhesive.

(1-iv. Bonding)

As the tacky agent, "CS9621" manufactured by Nitto Denko Corporation was prepared. By using this tacky agent, the long-length polarizing film, the long-length λ/2 plate, and the long-length λ/4 plate described above were bonded together in this order with their lengthwise directions in parallel to each other. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The long-length circularly polarizing plate thus obtained was evaluated by the above-mentioned methods.

Example 2

(2-i. Production of Polarizing Film)

A long-length polarizing film was produced by the same method as that in the step (1-i. Production of Polarizing Film) of Examples 1-1 to 1-8.

(2-ii. Production of λ/2 Plate)

A long-length λ/2 plate having properties shown in Table 1 was produced by the same method as that in the step (1-ii. Production of λ/2 Plate) of Examples 1-1 to 1-8.

(2-iii. Production of λ/4 Plate)

Polymethyl methacrylate ("Sumipex EX" manufactured by Sumitomo Chemical Co., Ltd., glass transition temperature of 103° C.) was press-molded at 250° C. using a press molding machine to obtain a pre-stretch film having a thickness of 110 μm. This pre-stretch film was stretched in its lengthwise direction under conditions of a stretching ratio of 2 times and a stretching temperature of 108° C. to obtain a long-length λ/4 plate (thickness of 75 μm).

(2-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The long-length circularly polarizing plate thus obtained was evaluated by the above-described methods.

Examples 3-1 to 3-3

(3-i. Production of Polarizing Film)

A long-length polarizing film was produced by the same method as that in the step (1-i. Production of Polarizing Film) of Examples 1-1 to 1-8.

(3-ii. Production of λ/2 Plate)

A long-length λ/2 plate having properties shown in Table 1 was produced by the same method as that in the step (1-ii. Production of λ/2 Plate) of Examples 1-1 to 1-8.

(3-iii. Production of λ/4 Plate)

A long-length pre-stretch film including a layer of the acrylic resin, a layer of the adhesive, a layer of the styrene-maleic acid copolymer resin, a layer of the adhesive, and a layer of the acrylic resin in this order was obtained by the same method as that in the step (1-iii. Production of λ/4 Plate) of Examples 1-1 to 1-8. The pre-stretch film was wound to obtain a feeding roll.

A tenter stretching machine capable of stretching the pre-stretch film while bending a travelling direction of the pre-stretch film as shown in FIG. 2 was prepared. The long-length pre-stretch film was fed out from the feeding roll and stretched in the above-mentioned tenter stretching machine to obtain an intermediate film. The obtained intermediate film was wound into a roll and collected. During this process, the feeding angle φ formed by a feeding direction of the pre-stretch film from the feeding roll and a winding direction of the intermediate film was set to 45°. The stretching temperature and the stretching ratio were adjusted in a range of 130° C. to 140° C. and a range of 1.3 times to 2.0 times, respectively, so as to enable production of a λ/4 plate having properties shown in Table 1 below.

The intermediate film thus obtained was subjected to a free uniaxial stretching in a lengthwise direction of the intermediate film to obtain a stretched film. During this process, the stretching temperature and the stretching ratio were adjusted in a range of 120° C. to 135° C. and a range of 1.1 times to 1.6 times, respectively, so as to enable production of a λ/4 plate having properties shown in Table 1 below. The stretched film was trimmed at both end portions in its width direction to obtain a long-length λ/4 plate. The long-length λ/4 plate thus obtained had a slow axis in a direction forming an angle θq shown in Table 1 relative to a lengthwise direction of the λ/4 plate. In the λ/4 plate, no phase difference was expressed in the acrylic resin layer and the adhesive layer.

(3-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Angles of θh and θq of the circularly polarizing plate, representing an angle formed by the slow axis of the λ/2 plate in a counterclockwise direction relative to the absorption axis of the polarizing film and an angle formed by the slow axis of the λ/4 plate in a counterclockwise direction relative to the absorption axis of the polarizing film, respectively, when viewed from a polarizing film side, were as shown in Table 1.

The long-length circularly polarizing plate thus obtained was evaluated by the above-described methods.

Examples 4-1 and 4-2

(4-i. Production of Polarizing Film)

A long-length polarizing film was produced by the same method as that in the step (1-i. Production of Polarizing Film) of Examples 1-1 to 1-8.

(4-ii. Production of λ/2 Plate)

A long-length λ/2 plate having properties shown in Table 1 was produced by the same method as that in the step (1-ii. Production of λ/2 Plate) of Examples 1-1 to 1-8.

(4-iii. Production of λ/4 Plate)

A long-length λ/4 plate having properties shown in Table 1 was produced by the same method as that in the step (1-iii. Production of λ/4 Plate) of Examples 1-1 to 1-8.

(4-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The circularly polarizing plate thus obtained was evaluated by the above-mentioned methods.

Examples 5-1 and 5-2

(5-i. Production of Polarizing Film)

A long-length polarizing film was produced by the same method as that in the step (1-i. Production of Polarizing Film) of Examples 1-1 to 1-8.

(5-ii. Production of λ/2 Plate)

A long-length λ/2 plate having properties shown in Table 1 was produced by the same method as that in the step (1-ii. Production of λ/2 Plate) of Examples 1-1 to 1-8.

(5-iii. Production of λ/4 Plate)

A long-length λ/4 plate having properties shown in Table 1 was produced by the same method as that in the step (1-iii. Production of λ/4 Plate) of Examples 1-1 to 1-8.

(5-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The circularly polarizing plate thus obtained was evaluated by the above-mentioned methods.

Comparative Example 1

(C1-i. Production of Polarizing Film)

A long-length polarizing film was produced by the same method as that in the step (1-i. Production of Polarizing Film) of Examples 1-1 to 1-8.

(C1-ii. Production of λ/2 Plate)

A long-length pre-stretch film was prepared by the same method as that in the step (1-ii. Production of λ/2 Plate) of Examples 1-1 to 1-8. The prepared long-length pre-stretch film was stretched using a tenter stretching machine in a direction forming an angle of 67.5° relative to a lengthwise direction of the pre-stretch film and trimmed at both end portions in a width direction to obtain a long-length λ/2 plate. During this process, the stretching temperature and the stretching ratio were adjusted in a range of 130° C. to 140° C. and a range of 1.3 times to 2.0 times, respectively, so as to enable production of a λ/2 plate having properties shown in Table 1 below. The long-length λ/2 plate thus obtained had a slow axis in a direction forming an angle θh shown in Table 1 relative to a lengthwise direction of the λ/2 plate.

(C1-iii. Production of λ/4 Plate)

A long-length pre-stretch film including a layer of the acrylic resin, a layer of the adhesive, a layer of the styrene-maleic acid copolymer resin, a layer of the adhesive, and a layer of the acrylic resin in this order was obtained by the same method as that in the step (1-iii. Production of λ/4 Plate) of Examples 1-1 to 1-8.

Subsequently, the pre-stretch film was stretched in its width direction using a tenter stretching machine and trimmed at both end portions in its width direction to obtain a long-length λ/4 plate. During this process, the stretching temperature and the stretching ratio were adjusted in a range of 120° C. to 140° C. and a range of 1.5 times to 3.0 times, respectively, so as to enable production of a λ/4 plate having properties shown in Table 1 below. The λ/4 plate thus obtained had a slow axis in a direction forming an angle θq shown in Table 1 relative to a lengthwise direction of the λ/4 plate. In the λ/4 plate, no phase difference was expressed in the acrylic resin layer and the adhesive layer.

(C1-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The circularly polarizing plate thus obtained was evaluated by the above-mentioned methods.

Comparative Example 2

(C2-i. Production of Polarizing Film)

A long-length polarizing film was produced by the same method as that in the step (1-i. Production of Polarizing Film) of Examples 1-1 to 1-8.

(C2-ii. Production of λ/2 Plate)

A long-length pre-stretch film was prepared by the same method as that in the step (1-ii. Production of λ/2 Plate) of Examples 1-1 to 1-8. The prepared long-length pre-stretch film was stretched using a tenter stretching machine in a direction forming an angle of 67.5° relative to a lengthwise direction of the pre-stretch film and trimmed at both end portions in a width direction to obtain a long-length λ/2 plate. During this process, the stretching temperature and the stretching ratio were adjusted in a range of 130° C. to 140° C. and a range of 1.3 times to 2.0 times, respectively, so as to enable production of a λ/2 plate having properties shown in Table 1 below. The long-length λ/2 plate thus obtained had a slow axis in a direction forming an angle θh shown in Table 1 relative to a lengthwise direction of the λ/2 plate.

(C2-iii. Production of λ/4 Plate)

Polymethyl methacrylate ("Sumipex EX" manufactured by Sumitomo Chemical Co., Ltd., glass transition temperature of 103° C.) was press-molded at 250° C. using a press molding machine to obtain a pre-stretch film having a thickness of 110 μm. This pre-stretch film was stretched in its width direction under conditions of a stretching ratio of 1.1 times to 3.0 times and a stretching temperature of 100° C. to 120° C. and trimmed at both end portions in its width direction to obtain a long-length λ/4 plate (thickness of 75 μm).

(C2-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The circularly polarizing plate thus obtained was evaluated by the above-mentioned methods.

Comparative Example 3

(C3-i. Production of Polarizing Film)

A long-length polarizing film was produced by the same method as that in the step (1-i. Production of Polarizing Film) of Examples 1-1 to 1-8.

(C3-ii. Production of λ/2 Plate)

A long-length pre-stretch film was prepared by the same method as that in the step (1-ii. Production of λ/2 Plate) of Examples 1-1 to 1-8. The prepared long-length pre-stretch film was stretched using a tenter stretching machine in a direction forming an angle of 75.0° relative to a lengthwise direction of the pre-stretch film and trimmed at both end portions in a width direction to obtain a long-length λ/2 plate. During this process, the stretching temperature and the stretching ratio were adjusted in a range of 130° C. to 140° C. and a range of 1.3 times to 2.0 times, respectively, so as to enable production of a λ/2 plate having properties shown in Table 1 below. The long-length λ/2 plate thus obtained had a slow axis in a direction forming an angle θh shown in Table 1 relative to the lengthwise direction of the λ/2 plate.

(C3-iii. Production of λ/4 Plate)

A long-length pre-stretch film including a layer of the acrylic resin, a layer of the adhesive, a layer of the styrene-maleic acid copolymer resin, a layer of the adhesive, and a layer of the acrylic resin in this order was prepared by the same method as that in the step (1-iii. Production of λ/4 Plate) of Examples 1-1 to 1-8.

Subsequently, the pre-stretch film was stretched using a tenter stretching machine in a direction forming an angle of 75.0° relative to a lengthwise direction of the pre-stretch film and trimmed at both end portions in a width direction to obtain a long-length λ/4 plate. During this process, the stretching temperature and the stretching ratio were adjusted in a range of 120° C. to 140° C. and a range of 1.5 times to 3.0 times, respectively, so as to enable production of a λ/4 plate having properties shown in Table 1 below. The λ/4 plate thus obtained had a slow axis in a direction forming an angle θq shown in Table 1 relative to the lengthwise direction of the λ/4 plate. In the λ/4 plate, no phase difference was expressed in the acrylic resin layer and the adhesive layer.

(C3-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The circularly polarizing plate thus obtained was evaluated by the above-mentioned methods.

Comparative Example 4

(C4-i. Production of Polarizing Film)

A long-length polarizing film was produced by the same method as that in the step (1-i. Production of Polarizing Film) of Examples 1-1 to 1-8.

(C4-ii. Production of λ/2 Plate)

A long-length λ/2 plate having properties shown in Table 1 was produced by the same method as that in the step (1-ii. Production of λ/2 Plate) of Examples 1-1 to 1-8.

(C4-iii. Production of λ/4 Plate)

A long-length pre-stretch film was prepared by the same method as that in the step (1-ii. Production of λ/2 Plate) of Examples 1-1 to 1-8. The pre-stretch film was stretched in its width direction using a tenter stretching machine and trimmed at both end portions in its width direction to obtain a long-length λ/4 plate. During this process, the stretching temperature and the stretching ratio were adjusted in a range of 120° C. to 140° C. and a range of 2 times to 5 times, respectively, so as to enable production of a λ/4 plate having properties shown in Table 1 below. The λ/4 plate thus obtained had a slow axis in a direction forming an angle θq shown in Table 1 relative to the lengthwise direction of the λ/4 plate.

(C4-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The circularly polarizing plate thus obtained was evaluated by the above-mentioned methods.

Comparative Example 5

(C5-i. Production of Polarizing Film)

A long-length polarizing film was produced by the same method as that in the step (1-i. Production of Polarizing Film) of Examples 1-1 to 1-8.

(C5-ii. Production of λ/2 Plate)

A long-length λ/2 plate having properties shown in Table 1 was produced by the same method as that in the step (1-ii. Production of λ/2 Plate) of Examples 1-1 to 1-8.

(C5-iii. Production of λ/4 Plate)

As a pre-stretch film, a long-length film made of a polycarbonate resin ("Iupilon S3000" manufactured by Mitsubishi Engineering-Plastics Corp., glass transition temperature of 150° C.) was prepared. The pre-stretch film was stretched in its width direction using a tenter stretching machine and trimmed at both end portions in its width direction to obtain a long-length λ/4 plate. During this process, the stretching temperature and the stretching ratio were adjusted in a range of 150° C. to 160° C. and a range of 2 times to 5 times, respectively, so as to enable production of a λ/4 plate having properties shown in Table 1 below. The λ/4 plate thus obtained had a slow axis in a direction forming an angle θq shown in Table 1 relative to a lengthwise direction of the λ/4 plate.

(C5-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The circularly polarizing plate thus obtained was evaluated by the above-mentioned methods.

Comparative Example 6

(C6-i. Production of Polarizing Film)

A long-length polarizing film was produced by the same method as that in the step (1-i. Production of Polarizing Film) of Examples 1-1 to 1-8.

(C6-ii. Production of λ/2 Plate)

A long-length pre-stretch film including a layer of the acrylic resin, a layer of the adhesive, a layer of the styrene-maleic acid copolymer resin, a layer of the adhesive, and a layer of the acrylic resin in this order was prepared by the same method as that in the step (1-iii. Production of λ/4 Plate) of Examples 1-1 to 1-8.

Subsequently, the pre-stretch film was stretched using a tenter stretching machine in a direction forming an angle of 67.5° relative to a lengthwise direction of the pre-stretch film and trimmed at both end portions in a width direction to obtain a long-length λ/2 plate. During this process, the stretching temperature and the stretching ratio were adjusted in a range of 110° C. to 140° C. and a range of 1.3 times to 4 times, respectively, so as to enable production of a λ/2 plate having properties shown in Table 1 below. The λ/2 plate thus obtained had a slow axis in a direction forming an angle θh shown in Table 1 relative to a lengthwise direction of the λ/2 plate. In the λ/2 plate, no phase difference was expressed in the acrylic resin layer and the adhesive layer.

(C6-iii. Production of λ/4 Plate)

The same long-length pre-stretch film used in the step (1-ii. Production of λ/2 Plate) of Examples 1-1 to 1-8 was prepared. The pre-stretch film was stretched in its width direction using a tenter stretching machine and trimmed at both end portions in its width direction to obtain a long-length λ/4 plate. During this process, the stretching temperature and the stretching ratio were adjusted in a range of 120° C. to 140° C. and a range of 2.0 times to 5.0 times, respectively, so as to enable production of a λ/4 plate having properties shown in Table 1 below. The λ/4 plate thus obtained had a slow axis in a direction forming an angle θq shown in Table 1 relative to a lengthwise direction of the λ/4 plate.

(C6-iv. Bonding)

The long-length polarizing film, the long-length λ/2 plate, and the long-length λ/4 plate were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by a slow axis of the λ/4 plate in a counterclockwise direction relative to the absorption axis of the polarizing film.

The circularly polarizing plate thus obtained was evaluated by the above-mentioned methods.

Comparative Example 7

(C7-i. Production of Polarizing Film)

A long-length polarizing film was produced by the same method as that in the step (1-i. Production of Polarizing Film) of Examples 1-1 to 1-8.

(C7-ii. Production of λ/2 Plate)

The same long-length pre-stretch film used in the step (1-ii. Production of λ/2 Plate) of Examples 1-1 to 1-8 was prepared. The prepared long-length pre-stretch film was stretched using a tenter stretching machine in a direction forming an angle of 45.0° relative to a lengthwise direction of the pre-stretch film and trimmed at both end portions in a width direction to obtain a long-length λ/2 plate. During this process, the stretching temperature and the stretching ratio were adjusted in a range of 130° C. to 140° C. and a range of 1.3 times to 2.0 times, respectively, so as to enable production of a λ/2 plate having properties shown in Table 1 below. The long-length λ/2 plate thus obtained had a slow axis in a direction forming an angle θh shown in Table 1 relative to a lengthwise direction of the λ/2 plate.

(C7-iii. Production of λ/4 Plate)

A long-length pre-stretch film including a layer of the acrylic resin, a layer of the adhesive, a layer of the styrene-maleic acid copolymer resin, a layer of the adhesive, and a layer of the acrylic resin in this order was obtained by the same method used in the step (1-iii. Production of λ/4 Plate) of Examples 1-1 to 1-8. The pre-stretch film was wound to obtain a feeding roll.

A tenter stretching machine capable of stretching the pre-stretch film while bending a travelling direction of the pre-stretch film as shown in FIG. 2 was prepared. The long-length pre-stretch film was fed out from the feeding roll and stretched in the above-mentioned tenter stretching machine to obtain a stretched film. The obtained stretched film was wound into a roll and collected. During this process, the feeding angle φ formed by a feeding direction of the pre-stretch film from the feeding roll and a winding direction of the stretched film was set to 45°. Further, the stretching temperature and the stretching ratio were adjusted in a range of 130° C. to 140° C. and a range of 1.3 times to 2.0 times, respectively, so as to enable production of a λ/4 plate having properties shown in Table 1 below.

The stretched film was trimmed at both end portions in its width direction to obtain a long-length λ/4 plate. The long-length λ/4 plate thus obtained had a slow axis in a direction forming an angle θq shown in Table 1 relative to a lengthwise direction of the λ/4 plate. In the λ/4 plate, no phase difference was expressed in the acrylic resin layer and the adhesive layer.

(C7-iv. Bonding)

The long-length polarizing film, the long-length λ/2 plate, and the long-length λ/4 plate described above were bonded together in this order with their lengthwise directions in parallel to each other by using the same tacky agent used in the step (1-iv. Bonding) of Examples 1-1 to 1-8. In this manner, a long-length circularly polarizing plate including the polarizing film, a layer of the tacky agent, the λ/2 plate, a layer of the tacky agent, and the λ/4 plate in this order was obtained. Values of θh and θq of the circularly polarizing plate when viewed from a polarizing film side were as shown in Table 1. The θh represents an angle formed by the slow axis of the λ/2 plate in a counterclockwise direction relative to the absorption axis of the polarizing film, and the θq represents an angle formed by the slow axis of the λ/4 plate in a counterclockwise direction relative to the absorption axis of the polarizing film.

The long-length circularly polarizing plate thus obtained was evaluated by the above-mentioned methods.

[Results]

Configurations of Examples and Comparative Examples described above and their results are shown in Table 1 and Table 2 below, respectively. The meanings of abbreviations used in Tables below are as follows.

COP: Cyclic olefin resin
PSt: Styrene-maleic acid copolymer resin
PMMA: Polymethyl methacrylate
PC: Polycarbonate resin
IDR: Intrinsic birefringence P: positive, N: negative
Re: In-plane phase difference at measurement wavelength of 590 nm
Rth: Thickness-direction phase difference at measurement wavelength of 590 nm
θh: Angle formed by slow axis of λ/2 plate in counterclockwise direction relative to absorption axis of polarizing film when circularly polarizing plate is viewed from polarizing film side
θq: Angle formed by slow axis of λ/4 plate in counterclockwise direction relative to absorption axis of polarizing film when circularly polarizing plate is viewed from polarizing film side
NZh: NZ factor of λ/2 plate
NZq: NZ factor of λ/4 plate

TABLE 1

[Configurations in Examples and Comparative Examples]

| | λ/2 plate | | | | | | λ/4 plate | | | | | | Difference in wavelength dispersion |
|---|---|---|---|---|---|---|---|---|---|---|---|---|---|
| | Resin | IDR | Re (nm) | Rth (nm) | θh (°) | NZh | Resin | IDR | Re (nm) | Rth (nm) | θq (°) | NZq | |

| Example | | | | | | | | | | | | | |
|---|---|---|---|---|---|---|---|---|---|---|---|---|---|
| 1-1 | COP | P | 250 | 161 | 22.5 | 1.15 | PSt | N | 118 | −59 | 90.0 | 0.00 | 0.116 |
| 1-2 | COP | P | 255 | 165 | 22.5 | 1.15 | PSt | N | 121 | −61 | 90.0 | 0.00 | 0.116 |
| 1-3 | COP | P | 260 | 168 | 22.5 | 1.15 | PSt | N | 125 | −62 | 90.0 | 0.00 | 0.116 |
| 1-4 | COP | P | 265 | 171 | 22.5 | 1.15 | PSt | N | 128 | −64 | 90.0 | 0.00 | 0.116 |
| 1-5 | COP | P | 270 | 174 | 22.5 | 1.15 | PSt | N | 132 | −66 | 90.0 | 0.00 | 0.116 |
| 1-6 | COP | P | 275 | 178 | 22.5 | 1.15 | PSt | N | 135 | −67 | 90.0 | 0.00 | 0.116 |
| 1-7 | COP | P | 280 | 181 | 22.5 | 1.15 | PSt | N | 138 | −69 | 90.0 | 0.00 | 0.116 |
| 1-8 | COP | P | 285 | 184 | 22.5 | 1.15 | PSt | N | 142 | −71 | 90.0 | 0.00 | 0.116 |
| 2 | COP | P | 260 | 168 | 22.5 | 1.15 | PMMA | N | 126 | −63 | 90.0 | 0.00 | 0.029 |
| 3-1 | COP | P | 260 | 168 | 15.0 | 1.15 | PSt | N | 128 | −99 | 75.0 | −0.27 | 0.116 |
| 3-2 | COP | P | 260 | 168 | 18.0 | 1.15 | PSt | N | 126 | −98 | 81.0 | −0.27 | 0.116 |
| 3-3 | COP | P | 260 | 168 | 27.0 | 1.15 | PSt | N | 123 | −95 | 99.0 | −0.27 | 0.116 |
| 4-1 | COP | P | 260 | 178 | 22.5 | 1.19 | PSt | N | 125 | −62 | 90.0 | 0.00 | 0.116 |
| 4-2 | COP | P | 260 | 189 | 22.5 | 1.23 | PSt | N | 125 | −62 | 90.0 | 0.00 | 0.116 |
| 5-1 | COP | P | 260 | 168 | 22.5 | 1.15 | PSt | N | 125 | −112 | 90.0 | −0.40 | 0.116 |
| 5-2 | COP | P | 260 | 168 | 22.5 | 1.15 | PSt | N | 125 | −137 | 90.0 | −0.60 | 0.116 |

| Comparative Example | | | | | | | | | | | | | |
|---|---|---|---|---|---|---|---|---|---|---|---|---|---|
| 1 | COP | P | 260 | 181 | 67.5 | 1.19 | PSt | N | 125 | −96 | 0.0 | −0.27 | 0.116 |
| 2 | COP | P | 260 | 181 | 67.5 | 1.19 | PMMA | N | 127 | −97 | 0.0 | −0.27 | 0.029 |
| 3 | COP | P | 260 | 181 | 75.0 | 1.19 | PSt | N | 128 | −87 | 15.0 | −0.27 | 0.116 |
| 4 | COP | P | 260 | 168 | 22.5 | 1.15 | COP | P | 127 | 86 | 90.0 | 1.18 | 0.000 |
| 5 | COP | P | 260 | 168 | 22.5 | 1.15 | PC | P | 125 | 85 | 90.0 | 1.18 | 0.118 |
| 6 | PSt | N | 260 | −179 | 22.5 | −0.19 | COP | P | 130 | 117 | 90.0 | 1.40 | −0.116 |
| 7 | COP | P | 260 | 168 | 45.0 | 1.15 | PSt | N | 125 | −62 | 135.0 | −0.24 | 0.116 |

TABLE 2

[Results of Examples and Comparative Examples]

| | Front direction | | Tile direction | |
|---|---|---|---|---|
| | Reflectivity | Visual observation | Reflectivity | Visual observation |
| Example | | | | |
| 1-1 | 0.10% | B | 1.74% | A |
| 1-2 | 0.08% | A | 1.80% | A |
| 1-3 | 0.06% | A | 1.86% | A |
| 1-4 | 0.05% | A | 1.94% | A |
| 1-5 | 0.04% | A | 2.03% | B |
| 1-6 | 0.04% | A | 2.13% | B |
| 1-7 | 0.05% | A | 2.25% | B |

TABLE 2-continued

[Results of Examples and Comparative Examples]

| | Front direction | | Tile direction | |
|---|---|---|---|---|
| | Reflectivity | Visual observation | Reflectivity | Visual observation |
| 1-8 | 0.06% | A | 2.37% | C |
| 2 | 0.11% | B | 1.84% | A |
| 3-1 | 0.08% | A | 1.98% | A |
| 3-2 | 0.05% | A | 1.88% | A |
| 3-3 | 0.12% | C | 1.78% | A |
| 4-1 | 0.06% | A | 2.12% | B |
| 4-2 | 0.06% | A | 2.40% | C |
| 5-1 | 0.06% | A | 1.90% | A |
| 5-2 | 0.06% | A | 2.24% | B |
| Comparative Example | | | | |
| 1 | 0.06% | A | 2.62% | D |
| 2 | 0.11% | B | 2.49% | C |
| 3 | 0.08% | A | 3.22% | E |
| 4 | 0.13% | C | 6.89% | E |
| 5 | 0.06% | A | 6.45% | E |
| 6 | 0.36% | E | 2.40% | C |
| 7 | 0.36% | E | 1.95% | A |

[Discussions]

As evident from Examples and Comparative Examples described above, it was confirmed that a long-length circularly polarizing plate capable of effectively reducing reflection of outside light in both a front direction and a tilt direction can be produced as a long-length film according to the present invention.

In particular, on the basis of Examples 1-1 to 1-8, it was confirmed that the λ/2 plate and the λ/4 plate each had a preferable range of a phase difference.

Further, on the basis of Example 2, it was confirmed that there was a preferable range in difference in wavelength dispersions between the λ/2 plate and the λ/4 plate.

Further, on the basis of Examples 3-1 to 3-3, it was confirmed that the λ/2 plate and the λ/4 plate each had a preferable range in a direction of slow axis.

Further, on the basis of Examples 4-1 and 4-2, it was confirmed that the λ/2 plate had a preferable range in the NZ factor (NZh).

Further, on the basis of Examples 5-1 and 5-2, it was confirmed that the λ/4 plate had a preferable range in the NZ factor (NZq).

DESCRIPTION OF NUMERALS

10 feeding roll
20 pre-stretch film
21 and 22 end portions of pre-stretch film
30 intermediate film
31 and 32 end portions of intermediate film
40 roll
50 λ/2 plate
60 roll
100 long-length circularly polarizing plate
110 polarizing film
111 absorption axis of polarizing film
112 axis as projected line of absorption axis of polarizing film on the surface of λ/2 plate
113 axis as projected line of absorption axis of polarizing film on the surface of λ/4 plate
120 λ/2 plate
121 slow axis of λ/2 plate
130 λ/4 plate
131 slow axis of λ/4 plate
140 broadband λ/4 plate
200 tenter stretching machine
210L and 210R grippers
220L and 220R guide rails
230 inlet portion of tenter stretching machine
240 outlet portion of tenter stretching machine
250 stretching zone of tenter stretching machine
300 roller stretching machine
310 upstream roll
320 downstream roll
400 production apparatus for producing circularly polarizing plate
410 circularly polarizing plate
420 polarizing film
430 λ/2 plate
440 λ/4 plate
450 bonding device
451 and 452 nip rolls

The invention claimed is:

1. A long-length circularly polarizing plate comprising: a polarizing film; a λ/2 plate having a slow axis in a direction forming an angle of 22.5°±10° relative to an absorption axis of the polarizing film; and a λ/4 plate having a slow axis in a direction forming an angle of 90°±20° relative to an absorption axis of the polarizing film, in this order, wherein
the λ/2 plate and the λ/4 plate have different wavelength dispersions, and
an NZ factor of the λ/4 plate represented by NZq satisfies NZq≤0.0, wherein
the NZ factor is a value represented by $(n_x-n_z)/(n_x-n_y)$, where nx represents a refractive index in a direction in which the maximum refractive index is given among directions perpendicular to the thickness direction (in-plane directions), ny represents a refractive index in one of the in-plane directions that is orthogonal to the nx direction, and nz represents a refractive index in a thickness direction.

2. The long-length circularly polarizing plate according to claim 1, satisfying the following formula (A):

Reh(400)/Reh(550)<Req(400)/Req(550)

wherein Reh(400) is an in-plane phase difference of the λ/2 plate at a wavelength of 400 nm,
Reh(550) is an in-plane phase difference of the λ/2 plate at a wavelength of 550 nm,
Req(400) is an in-plane phase difference of the λ/4 plate at a wavelength of 400 nm, and
Req(550) is an in-plane phase difference of the λ/4 plate at a wavelength of 550 nm.

3. The long-length circularly polarizing plate according to claim 1, satisfying the following formula (B):

Req(400)/Req(550)−Reh(400)/Reh(550)=0.12±0.08 wherein Reh(400) is an in-plane phase difference of the λ/2 plate at a wavelength of 400 nm,
Reh(550) is an in-plane phase difference of the λ/2 plate at a wavelength of 550 nm,
Req(400) is an in-plane phase difference of the λ/4 plate at a wavelength of 400 nm, and
Req(550) is an in-plane phase difference of the λ/4 plate at a wavelength of 550 nm.

4. The long-length circularly polarizing plate according to claim 1, wherein an NZ factor of the λ/2 plate represented by NZh and the NZ factor of the λ/4 plate represented by NZq satisfy:

1.0≤NZh≤1.3; and

−1.0≤NZq≤0.0.

5. The long-length circularly polarizing plate according to claim 1, wherein the λ/4 plate comprises a layer that is formed of a material having a negative intrinsic birefringence value.

6. The long-length circularly polarizing plate according to claim 1, wherein the λ/2 plate comprises a layer that is formed of a material having a positive intrinsic birefringence value.

7. The long-length circularly polarizing plate according to claim 1, wherein the polarizing film has an absorption axis in a lengthwise direction of the long-length circularly polarizing plate.

8. An organic electroluminescent display device comprising a circularly polarizing film piece obtained by cutting out the long-length circularly polarizing plate according to claim 1.

9. A liquid crystal display device comprising a circularly polarizing film piece obtained by cutting out the long-length circularly polarizing plate according to claim 1.

10. A long-length broadband λ/4 plate comprising:
a λ/2 plate having a slow axis in a direction forming an angle of 22.5°±10° relative to a lengthwise direction of the broadband λ/4 plate; and
a λ/4 plate having a slow axis in a direction forming an angle of 90°±20° relative to the lengthwise direction of the broadband λ/4 plate, wherein
the λ/2 plate and the λ/4 plate have different wavelength dispersions, and
an NZ factor of the λ/4 plate represented by NZq satisfies NZq≤0.0, wherein
the NZ factor is a value represented by (nx−nz)/(nx−ny), where nx represents a refractive index in a direction in which the maximum refractive index is given among directions perpendicular to the thickness direction (in-plane directions), ny represents a refractive index in one of the in-plane directions that is orthogonal to the nx direction, and nz represents a refractive index in a thickness direction.

11. The long-length broadband λ/4 plate according to claim 10, wherein the λ/2 plate is produced by a production method including diagonal stretching.

12. An organic electroluminescent display device comprising a broadband λ/4 film piece obtained by cutting out the long-length broadband λ/4 plate according to claim 10.

13. A liquid crystal display device comprising a broadband λ/4 film piece obtained by cutting out the long-length broadband λ/4 plate according to claim 10.

* * * * *